US008866208B2

(12) United States Patent
Lee

(10) Patent No.: US 8,866,208 B2
(45) Date of Patent: Oct. 21, 2014

(54) SEMICONDUCTOR DEVICES INCLUDING VERTICAL TRANSISTORS AND METHODS OF FABRICATING THE SAME

(71) Applicant: SK hynix Inc., Icheon-si (KR)

(72) Inventor: Jin Yul Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 13/719,100

(22) Filed: Dec. 18, 2012

(65) Prior Publication Data

US 2014/0035018 A1    Feb. 6, 2014

(30) Foreign Application Priority Data

Jul. 31, 2012    (KR) .................... 10-2012-0084010

(51) Int. Cl.
*H01L 27/108*    (2006.01)
*H01L 29/94*    (2006.01)
*H01L 49/02*    (2006.01)

(52) U.S. Cl.
CPC ........ *H01L 29/945* (2013.01); *H01L 27/10835* (2013.01); *H01L 27/10885* (2013.01); *H01L 28/90* (2013.01)
USPC .......................................... 257/302; 257/296

(58) Field of Classification Search
CPC . H01L 27/10; H01L 27/108; H01L 27/10829; H01L 27/10841; H01L 27/10805; H01L 27/10847; H01L 27/10864; H01L 27/10867
USPC ................................................. 257/296, 302
See application file for complete search history.

(56) References Cited

U.S. PATENT DOCUMENTS

| 6,282,116 | B1 * | 8/2001 | Kunkel et al. ............... 365/149 |
| 6,316,799 | B1 * | 11/2001 | Kunikiyo ...................... 257/296 |
| 6,660,581 | B1 * | 12/2003 | Yang et al. ................... 438/242 |
| 6,700,150 | B1 * | 3/2004 | Wu ................................ 257/296 |
| 6,797,590 | B2 * | 9/2004 | Park .............................. 438/430 |
| 2003/0201481 | A1 * | 10/2003 | Heo et al. ..................... 257/301 |
| 2004/0046200 | A1 * | 3/2004 | Wu ................................ 257/301 |
| 2010/0112753 | A1 * | 5/2010 | Lee ................................ 438/107 |
| 2013/0017629 | A1 * | 1/2013 | Pyo et al. ........................ 438/16 |

FOREIGN PATENT DOCUMENTS

| KR | 10-660891 | * 12/2006 |
| KR | 10-1036927 | 5/2011 |
| KR | 10-1046702 | 6/2011 |

* cited by examiner

*Primary Examiner* — A. Sefer
(74) *Attorney, Agent, or Firm* — Kilpatrick Townsend & Stockton LLP

(57) ABSTRACT

A semiconductor device includes a first capacitor in a trench of a semiconductor substrate and an active pillar disposed on the semiconductor substrate opposite the first capacitor. The active pillar includes first region, first channel region, second region, second channel region and third region, sequentially stacked. A pillar connection pattern electrically connects the first capacitor to a first source region. A first gate electrode is disposed on a sidewall of the first channel region. A common drain region is disposed in the second region, and a common bit line is disposed on a sidewall of the common drain region. A second gate electrode is disposed on a sidewall of the second channel region, and a second source region is disposed in the third region. A second capacitor is disposed on a top surface of the second source region opposite the second channel region.

15 Claims, 51 Drawing Sheets

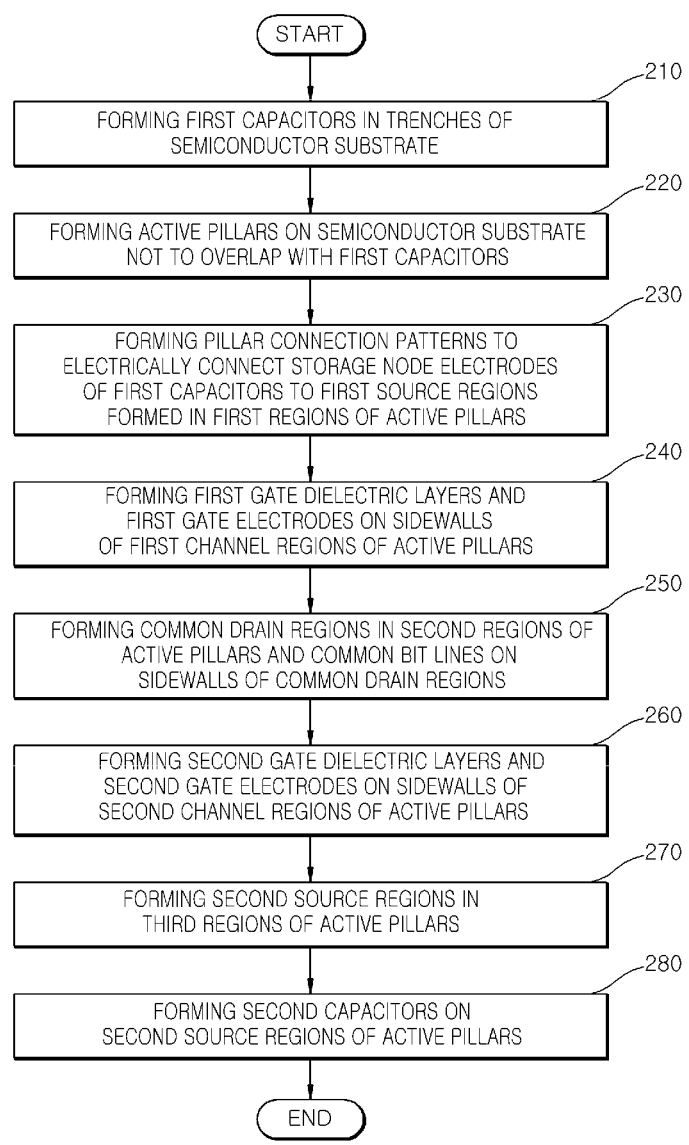

SEMICONDUCTOR DEVICES INCLUDING VERTICAL TRANSISTORS AND METHODS OF FABRICATING THE SAME

CROSS-REFERENCES TO RELATED APPLICATIONS

The present application claims priority under 35 U.S.C 119(a) to Korean Application No. 10-2012-0084010, filed on Jul. 31, 2012, in the Korean Intellectual Property Office, which is incorporated herein by reference in its entirety as set forth in full.

BACKGROUND

Embodiments of the present disclosure relate to semiconductor devices and methods of fabricating the same and, more particularly, to semiconductor devices including vertical transistors and methods of fabricating the same.

As mobile systems become more supplied and digital home appliances become excessively scaled down, semiconductor devices constituting the mobile systems or the digital home appliances have been more highly integrated. Particularly, various attempts to increase integration density of semiconductor memory devices have been made to store more data in a limited planar area. The semiconductor memory devices may include dynamic random access memory (DRAM) devices which are widely used and employed in the mobile systems and/or the digital home appliances. In general, each of memory cells of the DRAM devices includes a planar cell transistor and a cell capacitor stacked on the planar cell transistor, and the planar cell transistor has a source region and a drain region which are located at the same horizontal level on or in a semiconductor substrate. If a gate width (e.g., a channel length) of the planar cell transistor is reduced to have about 40 nanometers or less, the planar cell transistor may suffer from a short channel effect causing a channel leakage current and the channel leakage current may result in high power consumption.

Recently, vertical transistors have been proposed to overcome the disadvantages of the planar cell transistors. Each of the vertical transistors may include a drain region, a channel region and a source region which are vertically stacked in a semiconductor substrate such as a silicon substrate. Further, each of the vertical transistors may include a gate electrode disposed to cover at least a portion of a sidewall of the channel region. A method of fabricating a vertical transistor is taught in U.S. patent publication No. 2012-0135573 A1 to Kim, entitled "method for manufacturing vertical transistor having one side contact". If the vertical transistors are employed in the semiconductor memory devices, the integration density of the semiconductor memory devices may be increased without degradation of performance of the semiconductor memory devices.

SUMMARY

Example embodiments are directed to semiconductor devices including vertical transistors and methods of fabricating the same.

According to some embodiments, a semiconductor device includes a first capacitor in a trench of a semiconductor substrate and an active pillar disposed on a top surface of the semiconductor substrate opposite to the first capacitor. The active pillar includes a first region, a first channel region, a second region, a second channel region and a third region which are sequentially stacked. A pillar connection pattern is disposed to electrically connect the first capacitor to a first source region formed in the first region of the active pillar. A first gate electrode is disposed on a sidewall of the first channel region of the active pillar, and a common drain region is disposed in the second region of the active pillar. A common bit line is disposed on a sidewall of the common drain region, and a second gate electrode is disposed on a sidewall of the second channel region of the active pillar. A second source region is disposed in the third region of the active pillar, and a second capacitor is disposed on a top surface of the second source region opposite to the second channel region.

According to further embodiments, a semiconductor device includes an active pillar disposed on a semiconductor substrate to include a first source region, a common drain region and a second source region which are spaced apart from each other, a first capacitor disposed in a trench of a semiconductor substrate and electrically connected to the first source region, a common bit line electrically connected to the common drain region, a first gate electrode generating a first channel layer which is located between the first capacitor and the common bit line to transmit a bit signal, a second capacitor electrically connected to the second source region, and a second gate electrode generating a second channel layer which is located between the second capacitor and the common bit line to transmit the bit signal.

According to further embodiments, a method of fabricating a semiconductor device includes forming a first capacitor in a trench of a semiconductor substrate and forming an active pillar on a top surface of the semiconductor substrate opposite to the first capacitor. The active pillar is formed to include a first region, a first channel region, a second region, a second channel region and a third region which are sequentially stacked. A pillar connection pattern is formed to electrically connect the first capacitor to a first source region in the first region of the active pillar. A first gate electrode is formed on a sidewall of the first channel region, and a common drain region is formed in the second region. A common bit line is formed on a sidewall of the common drain region, and a second gate electrode is formed on a sidewall of the second channel region. A second source region is formed in the third region, and a second capacitor is formed on a top surface of the second source region opposite to the second channel region.

According to still other embodiments, a semiconductor device includes a first capacitor having a storage node electrode in a trench in a semiconductor substrate. An active pillar is disposed on a top surface of the semiconductor substrate adjacent to the first capacitor. The active pillar includes a first region, a second region, a third region, a fourth region, and a fifth region, which are sequentially stacked. The semiconductor device also includes a first source region formed in the first region of the active pillar, a pillar connection pattern configured for electrically connecting the storage node electrode of the first capacitor to the first source region, a first gate electrode on a sidewall of a first channel region formed in the second region of the active pillar, a common drain region formed in the third region of the active pillar, a common drain electrode on a sidewall of the common drain region, a second gate electrode on a sidewall of a second channel region formed in the fourth region of the active pillar, and a second source region formed in the fifth region of the active pillar. The semiconductor device also has a second capacitor stacked on the active pillar and having a storage node electrode formed on a top surface of the second source region.

In some embodiments of the above semiconductor device, the first gate electrode completely surrounds the sidewall of the second region of the active pillar, the common drain electrode completely surrounds the sidewall of the third region of the active pillar, and the second gate electrode completely surrounds the fourth region of the active pillar.

According to alternative embodiments, a semiconductor memory array includes a plurality of the semiconductor device described above. The semiconductor memory array includes a first word line connecting the first gate electrodes in a row of the semiconductor devices, and the first word line extends in a first direction which is parallel with a top surface of the semiconductor substrate. The semiconductor memory array also has a second word line connecting the second gate electrodes in said row of the semiconductor devices, and the second word line extends in said first direction which is parallel with a top surface of the semiconductor substrate. The semiconductor memory array also has a common bit line connecting the common drain electrodes in a column of the semiconductor devices, and the common bit line extends in a second direction which is perpendicular to the first direction and is parallel with the top surface of the semiconductor substrate.

BRIEF DESCRIPTION OF THE DRAWINGS

Embodiments of the inventive concept will become more apparent in view of the attached drawings and accompanying detailed description, in which:

FIG. 2 is a process flowchart illustrating a method of fabricating a semiconductor device according to an example embodiment;

FIGS. 3A to 18A are plan views illustrating a method of fabricating a semiconductor device according to an example embodiment;

FIGS. 3B to 18B are cross sectional views taken along lines A-A' of FIGS. 3A to 18A, respectively; and FIGS. 3C to 18C are cross sectional views taken along lines B-B' of FIGS. 3A to 18A, respectively.

DETAILED DESCRIPTION OF THE EMBODIMENTS

Figure 1A:
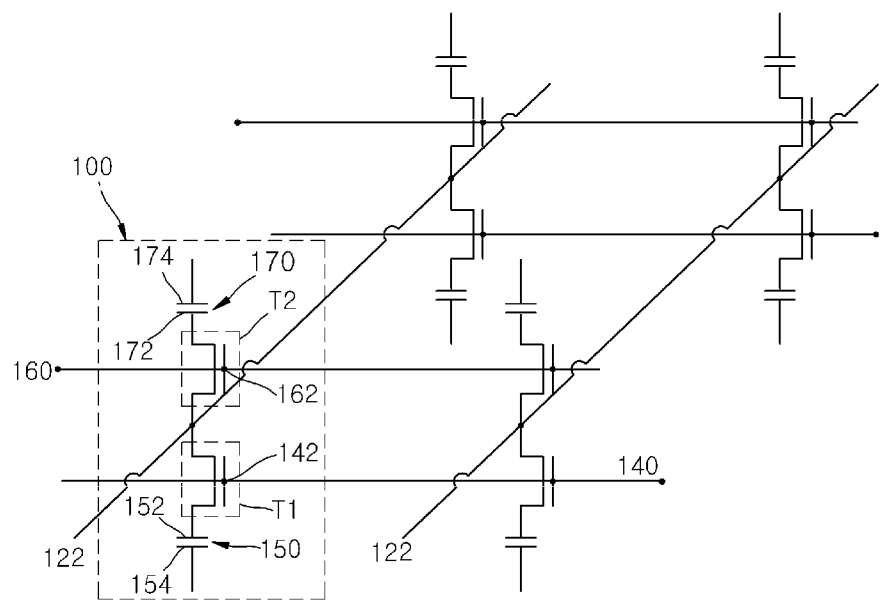
FIG. 1A illustrates an equivalent circuit diagram of a portion of a semiconductor device according to an example embodiment.

Example embodiments will now be described more fully with reference to the accompanying drawings, in which example embodiments are shown. Example embodiments may, however, be embodied in many different forms and should not be construed as being limited to the embodiments set forth herein. Rather, these embodiments are provided so that this disclosure will be thorough and complete, and will fully convey the concept of example embodiments to those of ordinary skill in the art. In the drawings, the thicknesses or the widths of layers and regions are exaggerated for clarity.

It will be understood that when an element is referred to as being "coupled to," "connected to," "responsive to," or "on" another element, it can be directly coupled to, connected to, responsive to, or on the other element, or intervening elements may also be present. In contrast, when an element is referred to as being "directly coupled to," "directly connected to," "directly responsive to," or "directly on" another element, there are no intervening elements present. As used herein the term "and/or" includes any and all combinations of one or more of the associated listed items. The same reference numerals or the same reference designators denote substantially the same elements throughout the specification.

As used herein, the singular forms "a," "an," and "the" are intended to include the plural forms as well, unless the context clearly indicates otherwise. It will be further understood that the terms "has," "having," "comprises," "comprising," "includes," and/or "including," when used herein, specify the presence of stated features, steps, operations, elements, and/or components, but do not preclude the presence or addition of one or more other features, steps, operations, elements, components, and/or groups thereof.

Moreover, in explanation of methods such as fabrication methods, the sequence of the process steps described herein may be changed unless the context clearly indicates a specific order. That is, the process steps may be performed in the same order as described herein or in a different order from the descriptions.

FIG. 1A illustrates an equivalent circuit diagram of a portion of a semiconductor device according to an example embodiment. Referring to FIG. 1A, a semiconductor device according to an example embodiment may include common bit lines 122, a first word line 140 disposed below the common bit lines 122, a second word line 160 disposed over the common bit lines 122, and first and second capacitors 150 and 170 electrically connected to each of the common bit lines 122. In FIG. 1A, a unit cell 100 may include a first gate electrode 142 receiving a control signal through the first word line 140 and a second gate electrode 162 receiving another control signal through the second word line 160. The first gate electrode 142 may correspond to a gate electrode of a lower transistor T1, and source and drain regions of the lower transistor T1 may be electrically connected to the first capacitor 150 and a selected one of the common bit lines 122, respectively. Similarly, the second gate electrode 162 may correspond to a gate electrode of an upper transistor T2, and source and drain regions of the upper transistor T2 may be electrically connected to the second capacitor 170 and the selected one of the common bit lines 122, respectively.

In the unit cell 100, if a bit signal is applied to the selected common bit line 122 and a voltage over a threshold voltage of the lower transistor T1 is applied to the first gate electrode 142, the lower transistor T1 may be turned on to store a datum corresponding to the bit signal in the first capacitor 150. The first capacitor 150 may include a first storage node electrode 152 electrically connected to the lower transistor T1 and a plate electrode 154 facing the first storage node electrode 152. The plate electrode 154 may be grounded or may have a predetermined electric potential. If a bit signal is applied to the selected common bit line 122 and a voltage over a threshold voltage of the upper transistor T2 is applied to the second gate electrode 162, the upper transistor T2 may be turned on to store a datum corresponding to the bit signal in the second capacitor 170. The second capacitor 170 may include a second storage node electrode 172 electrically connected to the upper transistor T2 and a plate electrode 174 facing the second storage node electrode 172. The plate electrode 174 may be grounded or may have a predetermined electric potential.

As described above, if a voltage over the threshold voltages of the lower and upper transistors T1 and T2 is applied to any one of the first and second gate electrodes 142 and 162 when the bit signal is applied to the selected common bit line 122, a datum corresponding to the bit signal may be stored in one of the first and second capacitors 150 and 170. In some embodiments, the semiconductor device may be designed such that a control signal is independently applied to the first and second word lines 140 and 160 and the first capacitor 150 has a different capacitance from the second capacitor 170. In such a case, the unit cell 100 may operate as a multi-bit cell. For example, the unit cell 100 may have a first logic state if both the first and second capacitors 150 and 170 are not charged, the unit cell 100 may have a second logic state if only the first capacitor 150 is charged, the unit cell 100 may have a third logic state if only the second capacitor 170 is charged, and the unit cell 100 may have a fourth logic state if both the first and second capacitors 150 and 170 are charged. An electric potential (corresponding to one of the first to fourth logic states) induced by the first and second capacitors 150 and 170 may be transmitted to the selected common bit line 122 when the lower and upper transistors T1 and T2 are turned on, and the electric potential of the selected common bit line 122 may be amplified by a sense amplifier electrically connected to the selected common bit line 122. Further, the sense amplifier may discriminate the logic state of the unit cell 100 using the amplified electric potential and may output the corresponding datum.

Figure 1B:
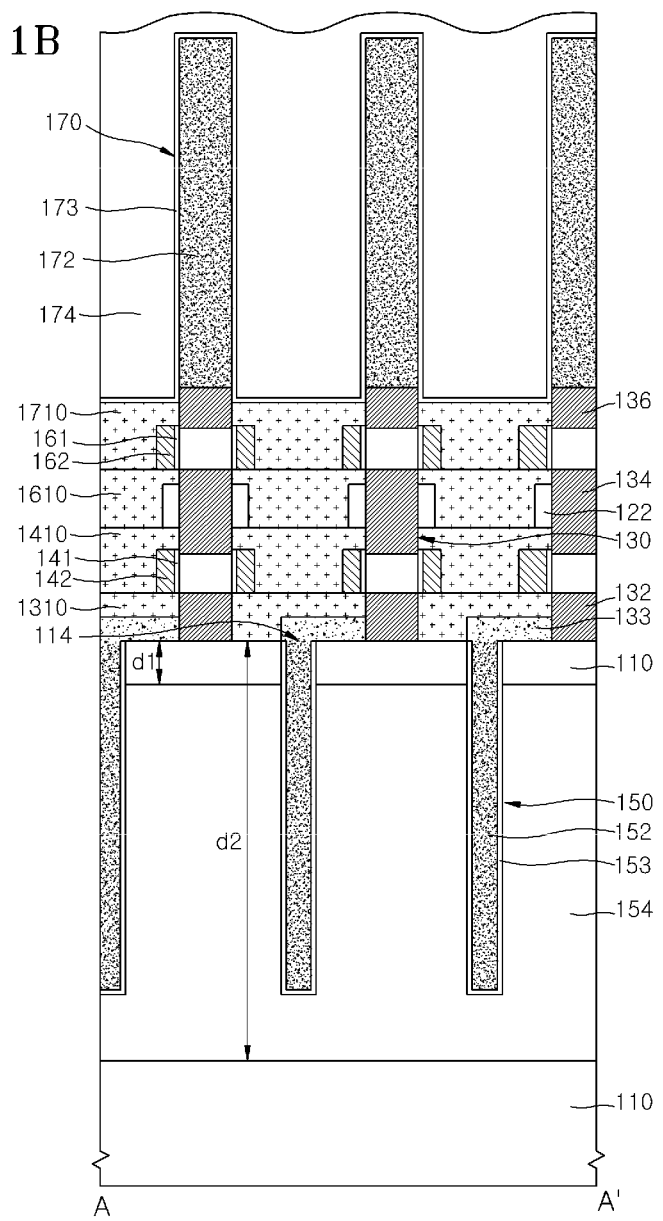
FIG. 1B is a cross sectional view illustrating a portion of a semiconductor device according to an example embodiment.
Figure 3A:
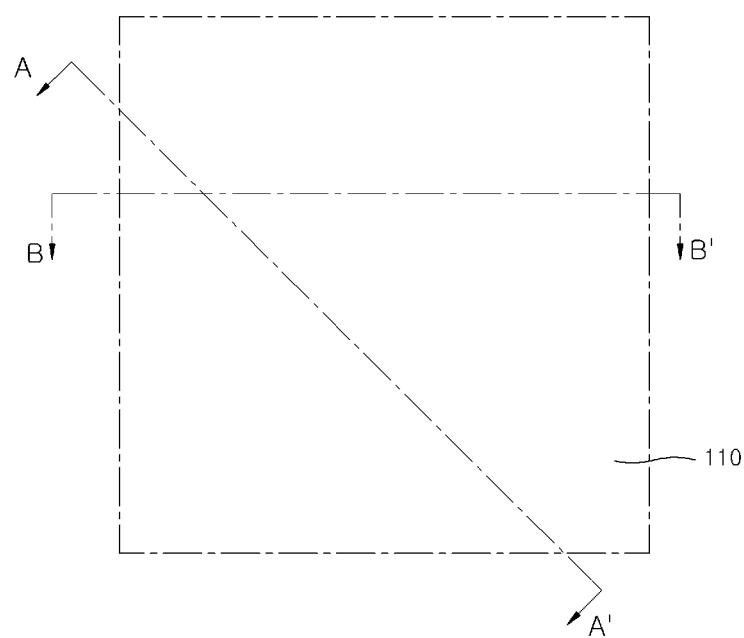
Figure 3B:
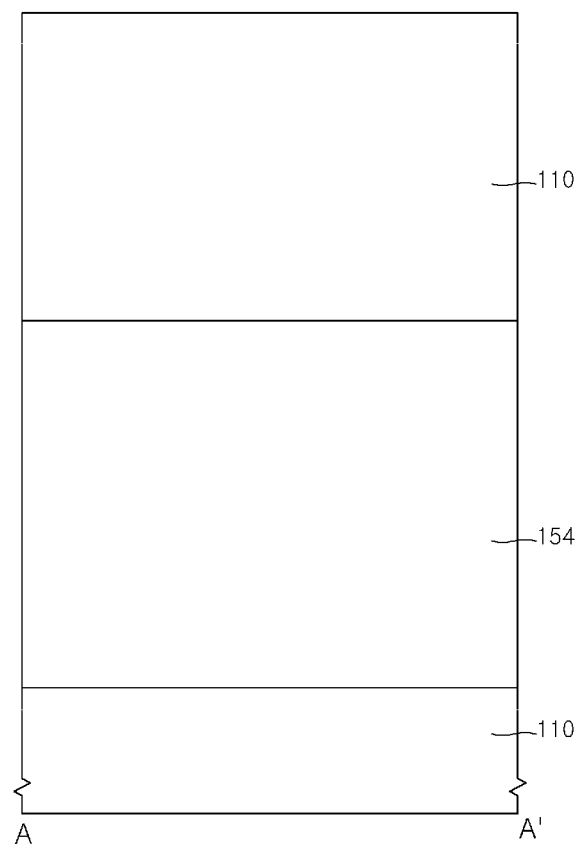
Figure 3C:
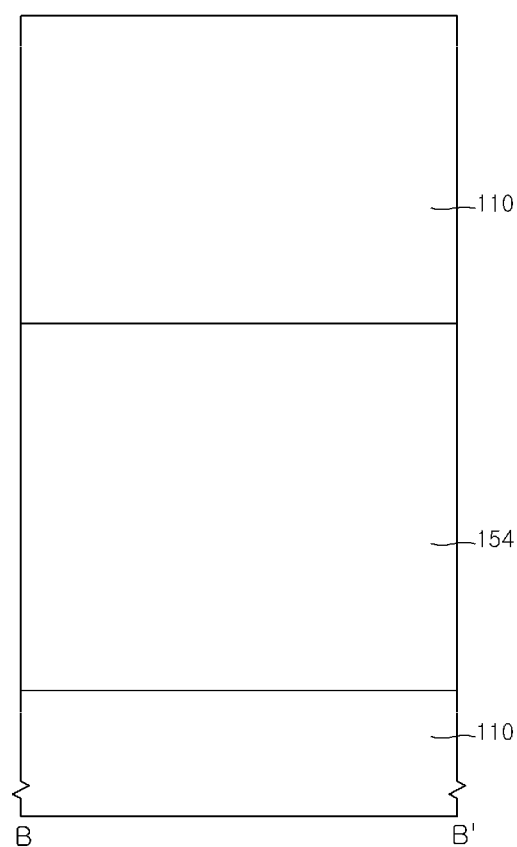

FIG. 1B is a cross sectional view illustrating a portion of a semiconductor device according to an example embodiment. Referring to FIG. 1B, a semiconductor device according to an example embodiment may include first capacitors 150 disposed in respective ones of trenches 114 in a semiconductor substrate 110, active pillars 130 disposed on the semiconductor substrate 110, and pillar connection patterns 133 electrically connecting the first capacitors 150 to respective ones of the active pillars 130. The semiconductor device may further include first gate electrodes 142 disposed on respective ones of lower sidewalls of the active pillars 130, common bit lines 122 disposed on respective ones of middle sidewalls of the active pillars 130, and second gate electrodes 162 disposed on respective ones of upper sidewalls of the active pillars 130. In addition, the semiconductor device may include second capacitors 170 disposed on respective ones of the active pillars 130. The semiconductor substrate 110 may be a silicon substrate doped with p-type impurities.

The first capacitors 150 may be trench structural capacitors. Each of the first capacitors 150 may include a capacitor dielectric layer 153 and a storage node electrode 152 which are sequentially stacked on an inner surface (e.g., a bottom surface and a sidewall surface) of a trench 114 in the semiconductor substrate 110. The capacitor dielectric layer 153 may include, for example, at least one of a tantalum oxide ($TaO_2$) layer, a zirconium oxide ($ZrO_2$) layer, an aluminum oxide ($Al_2O_3$) layer and a hafnium oxide ($HfO_2$) layer. The storage node electrode 152 may include, for example, at least one of a doped silicon layer, a titanium (Ti) layer, a tantalum (Ta) layer, a ruthenium (Ru) layer, an iridium (Ir) layer, a tungsten (W) layer, a titanium nitride (TiN) layer, a tantalum nitride (TaN) layer, a ruthenium oxide ($RuO_2$) layer and a tungsten nitride (WN) layer. The first capacitors 150 may share a doped semiconductor layer 154 that surrounds the trenches 114 to act as a plate electrode thereof. The plate electrode 154 may be a well region which is formed by implanting or injecting impurities into the semiconductor substrate 110 with a relatively high dose. A top surface of the plate electrode 154 may be located at a first depth D1 from a top surface of the semiconductor substrate 110, and a bottom surface of the plate electrode 154 may be located at a second depth D2 from the top surface of the semiconductor substrate 110. The first depth D1 is less than a depth of the trenches 114, and the second depth D2 is greater than a depth of the trenches 114. The plate electrode 154 may have an opposite conductivity type to the semiconductor substrate 110. For example, when the semiconductor substrate 110 is a p-type substrate, the plate electrode 154 may have an n-type.

The active pillars 130 may be disposed not to overlap with the first capacitors 150 when viewed from a plan view. The active pillars 130 may be the same material as the semiconductor substrate 110. For example, the active pillars 130 may be a plurality of protrusions that upwardly extend from the semiconductor substrate 110. That is, the active pillars 130 may be formed by etching a portion of the semiconductor substrate 110. Each of the active pillars 130 may have a cylinder-shaped pillar or a polygonal pillar. That is, each of the active pillars 130 may have a circular shape or a polygonal shape when viewed form a plan view. The active pillars 130 may act as bodies of vertical transistors. That is, each of the active pillars 130 may include a first source region 132, a first channel region, a common drain region 134, a second channel region and a second source region 136. The first source region 132, the common drain region 134 and the second source region 136 may be disposed in a first region, a second region and a third region of each active pillar 130, respectively. The first source region 132, the common drain region 134 and the second source region 136 may be n-type regions which are disposed at a sidewall surface of each of the active pillars 130 or in a bulk region of each of the active pillars 130. Unlike the drawing of FIG. 1B, the first source region 132, the common drain region 134 and the second source region 136 may be conductive layers which are disposed on a sidewall surface of each of the active pillars 130.

The pillar connection patterns 133 may be disposed on the semiconductor substrate 110. The pillar connection patterns 133 may electrically connect the storage node electrodes 152 of the first capacitors 150 to the first source regions 132. The pillar connection patterns 133 may be, for example, doped silicon patterns. Specifically, when the semiconductor substrate 110 contacting the pillar connection patterns 133 has a p-type, the pillar connection patterns 133 may be n-type silicon patterns.

The first gate electrodes 142 may be disposed on respective ones of sidewalls of the first channel regions between the first source regions 132 and the common drain regions 134, and first gate dielectric layers 141 may be disposed between the first gate electrodes 142 and the first channel regions. In some embodiments, the first gate dielectric layers 141 may be disposed to surround the sidewalls of the first channel regions. Each of the first gate dielectric layers 141 may include, for example, at least one of a silicon oxide ($SiO_2$) layer, a silicon nitride (SiN) layer, a silicon oxynitride (SiON) layer, a hafnium oxide ($HfO_2$) layer, an aluminum oxide ($Al_2O_3$) layer and a tantalum oxide ($TaO_2$) layer. The first gate electrodes 142 may be disposed to surround outer sidewalls of the first gate dielectric layers 141 opposite to the active pillars 130 (e.g., the first channel regions). Further, the first gate electrodes 142 may extend in a first direction, which is parallel with a top surface of the semiconductor substrate 110, to act as first word lines. A first interlayer insulation layer 1310 may be disposed between the pillar connection patterns 133 and the first gate electrodes 142, thereby electrically insulating the pillar connection patterns 133 from the first gate electrodes 142.

The common bit lines 122 may be disposed on respective ones of sidewalls of the common drain regions 134. The common bit lines 122 may be electrically connected to respective ones of the common drain regions 134, and bit signals applied to the common bit lines 122 may be transmitted to the common drain regions 134. In some embodiments, the common bit lines 122 may be disposed to surround respective ones of sidewalls of the common drain regions 134 of the active pillars 130. Further, the common bit lines 122 may extend in a second direction, which is parallel with a top surface of the semiconductor substrate 110 and perpendicular to the first direction, to act as bit lines. A second interlayer insulation layer 1410 may be disposed between the first gate electrodes 142 and the common bit lines 122, thereby electrically insulating the common bit lines 122 from the first gate electrodes 142.

The second gate electrodes 162 may be disposed on respective ones of sidewalls of the second channel regions between the second source regions 136 and the common drain regions 134, and second gate dielectric layers 161 may be disposed between the second gate electrodes 162 and the second channel regions. In some embodiments, the second gate dielectric layers 161 may be disposed to surround the sidewalls of the second channel regions. Each of the second gate dielectric layers 161 may include, for example, at least one of a silicon oxide ($SiO_2$) layer, a silicon nitride (SiN) layer, a silicon oxynitride (SiON) layer, a hafnium oxide ($HfO_2$) layer, an aluminum oxide ($Al_2O_3$) layer and a tantalum oxide ($TaO_2$) layer. The second gate electrodes 162 may be disposed to surround outer sidewalls of the second gate dielectric layers 161 opposite to the active pillars 130 (e.g., the second channel regions). Further, the second gate electrodes 162 may extend in the first direction to act as second word lines. A third interlayer insulation layer 1610 may be disposed between the common bit lines 122 and the second gate electrodes 162, thereby electrically insulating the common bit lines 122 from the second gate electrodes 162. The second gate electrodes 161 and the third interlayer insulation layer 1610 may be covered with a fourth interlayer insulation layer 1710.

The second capacitors 170 may be disposed on respective ones of the second source regions 136 (e.g., the third regions) of the active pillars 130. Each of the second capacitors 170 may include a storage node electrode 172 and a capacitor dielectric layer 173. Further, each of the second capacitors 170 may include a plate electrode 174 which is disposed on a surface of the capacitor dielectric layer 173 opposite to the storage node electrodes 172. The storage node electrodes 172 may be electrically connected to respective ones of the second source regions 136. Each of the storage node electrodes 172 may include, for example, at least one of a doped silicon layer, a titanium (Ti) layer, a tantalum (Ta) layer, a ruthenium (Ru) layer, an iridium (Ir) layer, a tungsten (W) layer, a titanium nitride (TiN) layer, a tantalum nitride (TaN) layer, a ruthenium oxide ($RuO_2$) layer and a tungsten nitride (WN) layer. The capacitor dielectric layer 173 may include, for example, at least one of a tantalum oxide ($TaO_2$) layer, a zirconium oxide ($ZrO_2$) layer, an aluminum oxide ($Al_2O_3$) layer and a hafnium oxide ($HfO_2$) layer. The plate electrode 174 may include, for example, at least one of a doped silicon layer, a titanium (Ti) layer, a tantalum (Ta) layer, a ruthenium (Ru) layer, an iridium (Ir) layer, a tungsten (W) layer, a titanium nitride (TiN) layer, a tantalum nitride (TaN) layer, a ruthenium oxide ($RuO_2$) layer and a tungsten nitride (WN) layer. The first source region 132 and the common drain region 134 disposed in one of the active pillars 130 as well as the first gate electrode 142 therebetween may constitute a first vertical transistor, that is, a lower vertical transistor (T1 of FIG. 1), and the second source region 136 and the common drain region 134 disposed in one of the active pillars 130 as well as the second gate electrode 162 therebetween may constitute a second vertical transistor, that is, an upper vertical transistor (T2 of FIG. 1).

As described above, bit signals may be applied to the common bit lines 122. If the first vertical transistors or the second vertical transistors are turned on, the bit signals may be transmitted to the first source regions 132 or the second source regions 136 through the turned-on vertical transistors. As a result, data corresponding to the bit signals may be stored in the first capacitors 150 or the second capacitors 170. In some embodiments, the semiconductor device may be designed such that control signals are independently applied to the first gate electrodes 142 and the second gate electrodes 162 and the first capacitors 150 have a different capacitance from the second capacitors 170. In such a case, a semiconductor memory device having multi-bit cells may be realized.

FIG. 2 is a process flowchart illustrating a method of fabricating a semiconductor device according to an example embodiment, and FIGS. 3A to 18A are plan views illustrating a method of fabricating a semiconductor device according to an example embodiment. FIGS. 3B to 18B are cross sectional views taken along lines A-A' of FIGS. 3A to 18A, respectively. FIGS. 3C to 18C are cross sectional views taken along lines B-B' of FIGS. 3A to 18A, respectively.

Referring to FIGS. 2 (a block 210), 3A to 5A, 3B to 5B, and 3C to 5C, first capacitors 150 may be formed in respective ones of trenches 114 of a semiconductor substrate 110. Specifically, the semiconductor substrate 110 may be provided. The semiconductor substrate 110 may be, for example, a p-type substrate. A plate electrode 154 may be formed in the semiconductor substrate 110. The plate electrode 154 may be a well region which is heavily doped with impurities. In some embodiments, when the semiconductor substrate 110 is doped with p-type impurities, the plate electrode 154 may be doped with n-type impurities. In such a case, the plate electrode 154 may be formed by implanting phosphorous (P) ions or arsenic (As) ions into the semiconductor substrate 110 with a relatively high dose. A depth and a thickness of the plate electrode 154 may be appropriately adjusted in consideration of a final height (or a depth) of the first capacitors 150 completed after active pillars are formed in a subsequent process.

Figure 4A:
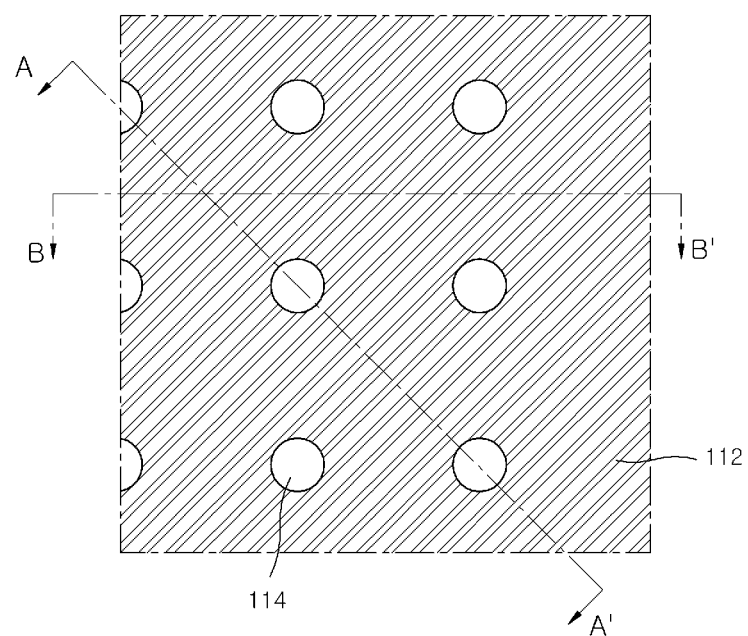
Figure 4B:
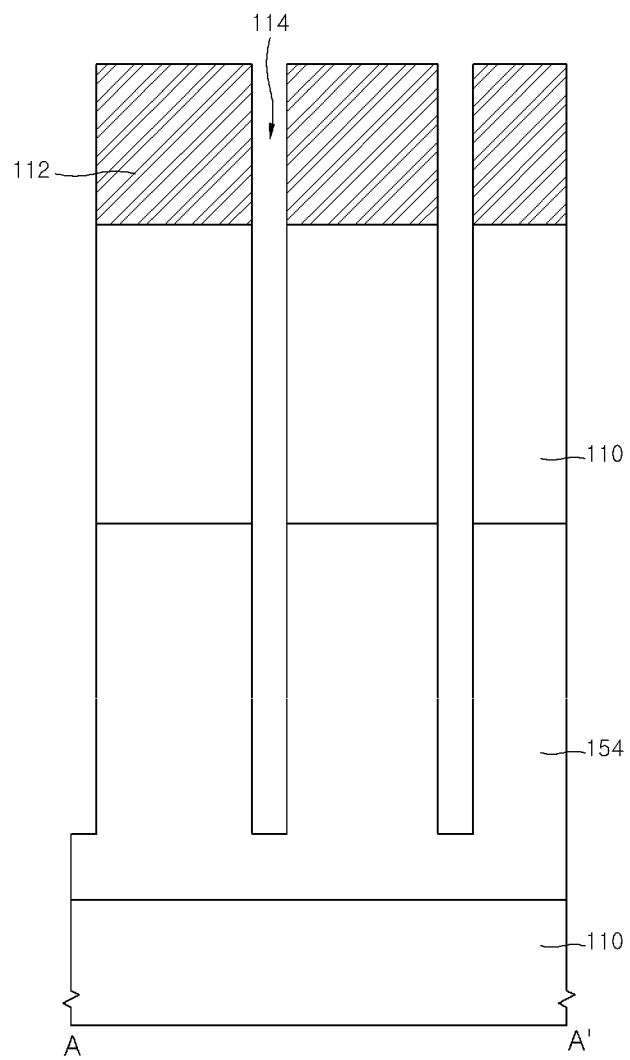
Figure 4C:
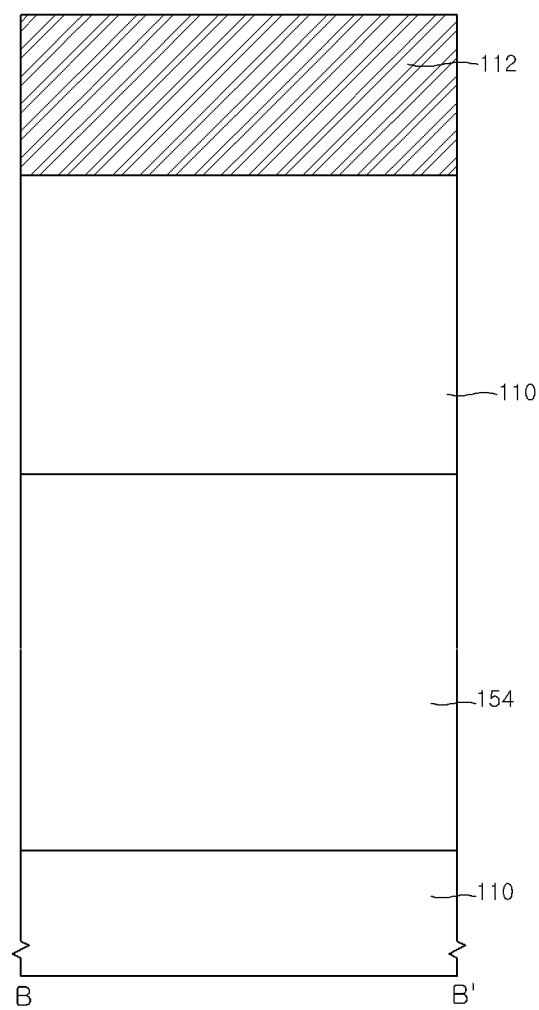

Referring to FIGS. 4A, 4B and 4C, trenches 114 may be formed in the semiconductor substrate 110. Specifically, a hard mask layer may be formed on the semiconductor substrate 110. The hard mask layer may be formed of a material layer having an etch selectivity with respect to the semiconductor substrate 110. For example, the hard mask layer may be formed of a nitride layer or an oxide layer. In some embodiments, the hard mask layer may be formed using an evaporation process, a coating process, a chemical vapor deposition (CVD) process, a sputtering process or the like. A photoresist pattern (not shown) may be formed on the hard mask layer, and the hard mask layer may be etched using the photoresist pattern as an etch mask to form a hard mask pattern 112. The hard mask pattern 112 may be formed to have holes penetrating the hard mask layer, and the holes may be formed to have a predetermined width. The semiconductor substrate 110 may be etched using the hard mask pattern 112 as an etch mask to form the trenches 114 in the semiconductor substrate 110. The trenches 114 may be formed such that bottom surfaces of the trenches 114 are located in the plate electrode 154. The photoresist pattern may be removed before or after formation of the trenches 114.

Figure 5A:
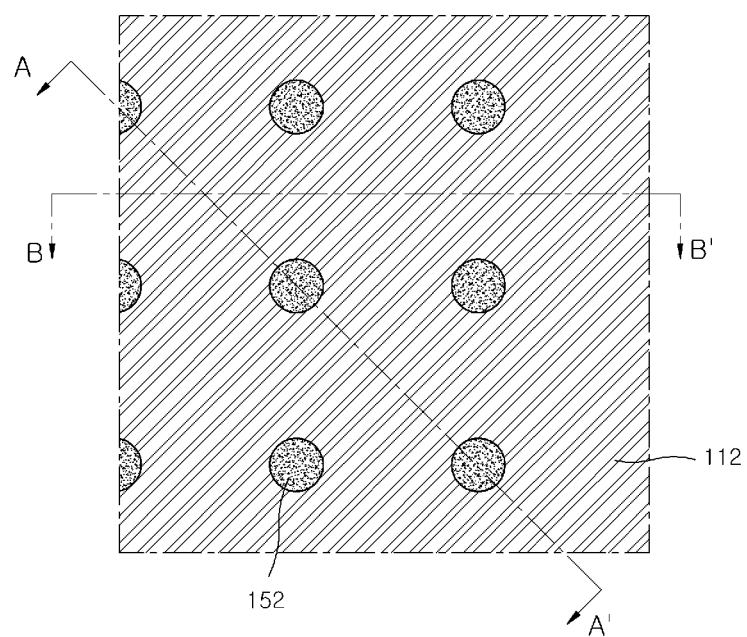
Figure 5B:
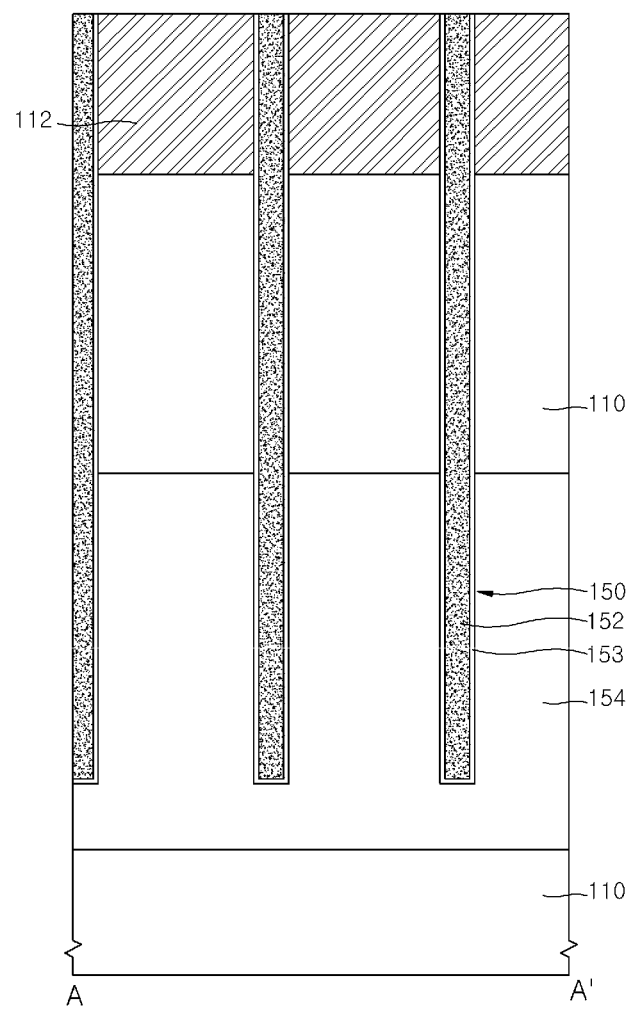
Figure 5C:
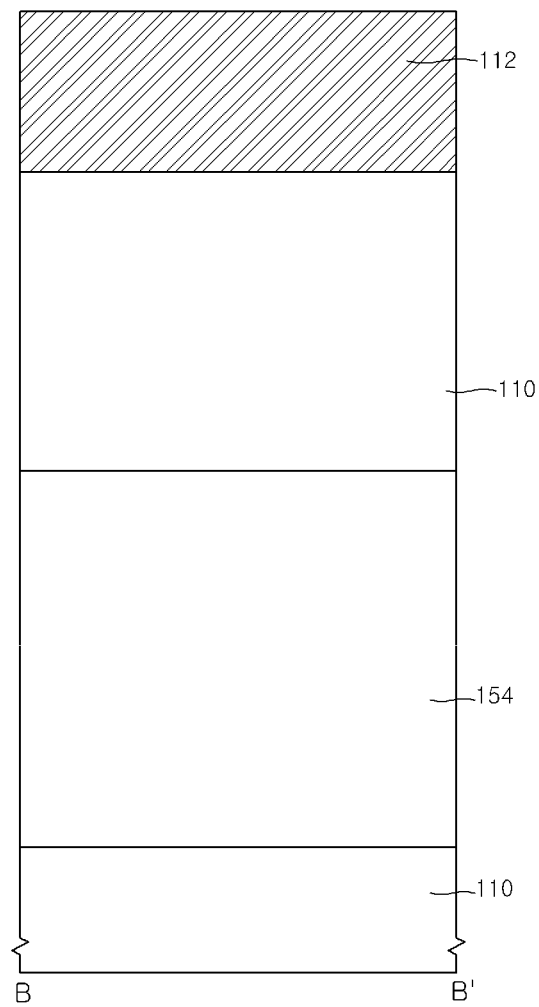

Referring to FIGS. 5A, 5B and 5C, the first capacitors 150 may be formed in respective ones of the trenches 114. Specifically, a capacitor dielectric layer 153 may be conformally formed in the trenches 114. The capacitor dielectric layer 153 may be formed of an oxide layer, for example, at least one of a tantalum oxide ($TaO_2$) layer, a zirconium oxide ($ZrO_2$) layer, an aluminum oxide ($Al_2O_3$) layer and a hafnium oxide ($HfO_2$) layer. The capacitor dielectric layer 153 may be formed using a chemical vapor deposition (CVD) process, an evaporation process or an atomic layer deposition (ALD) process. A storage node electrode layer may be formed to fill the trenches 114 surrounded by the capacitor dielectric layer 153. The storage node electrode layer may be formed to include, for example, a doped silicon layer, a titanium (Ti) layer, a tantalum (Ta) layer, a ruthenium (Ru) layer, an iridium (Ir) layer, a tungsten (W) layer, a titanium nitride (TiN) layer, a tantalum nitride (TaN) layer, a ruthenium oxide ($RuO_2$) layer or a tungsten nitride (WN) layer. The storage node electrode layer may be formed using a chemical vapor deposition (CVD) process, an evaporation process, an atomic layer deposition (ALD) process or a sputtering process. The storage node electrode layer and the capacitor dielectric layer 153 may be planarized using a chemical mechanical polishing (CMP) process, thereby exposing a top surface of the hard mask pattern 112. As result, storage node electrodes 152 separated from each other may be formed in respective ones of the trenches 114. The capacitor dielectric layer 153 and the storage node electrode 152 in each trench 114 may constitute one of the first capacitors 150, and the first capacitors 150 may share the plate electrode 154.

Figure 6A:
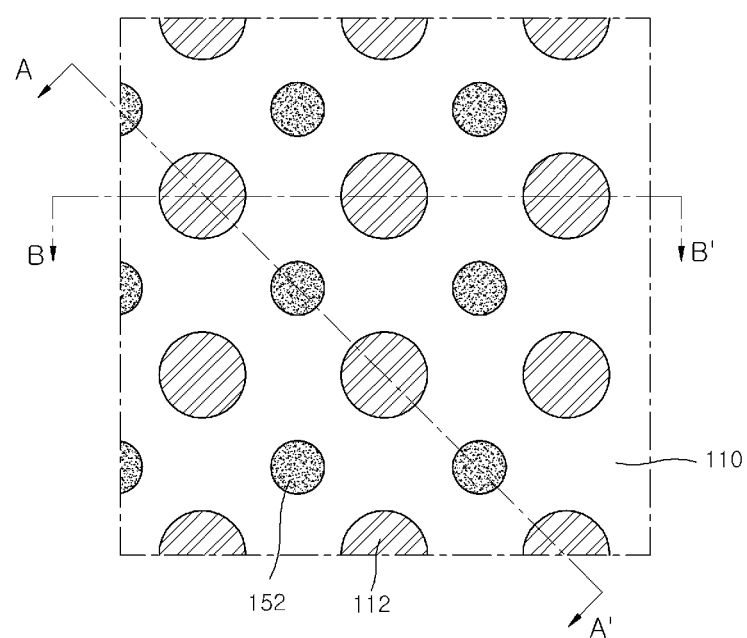
Figure 6B:
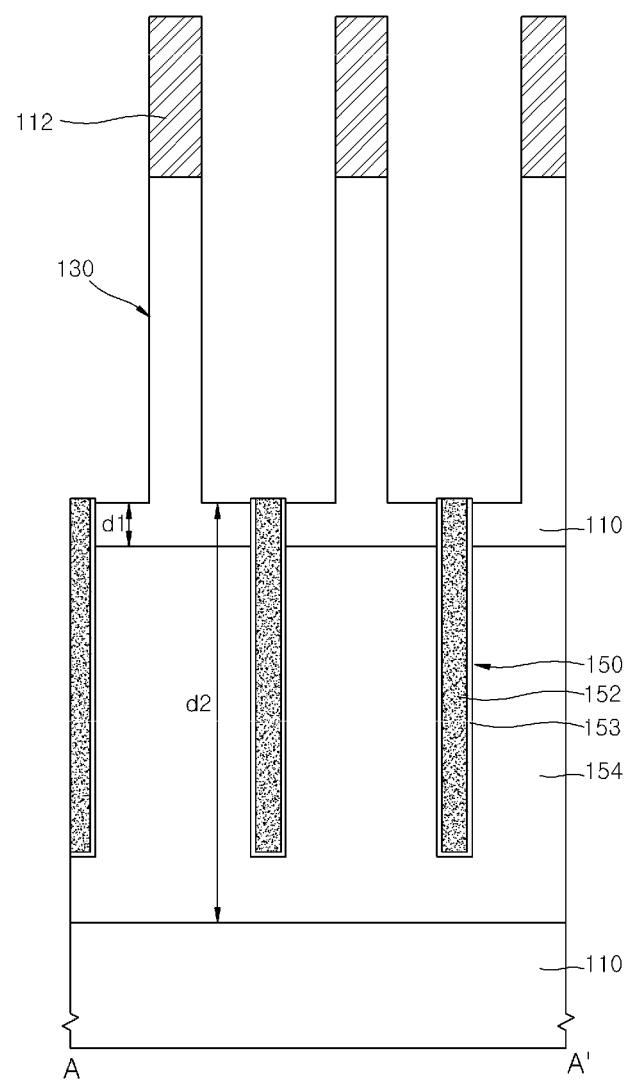
Figure 6C:
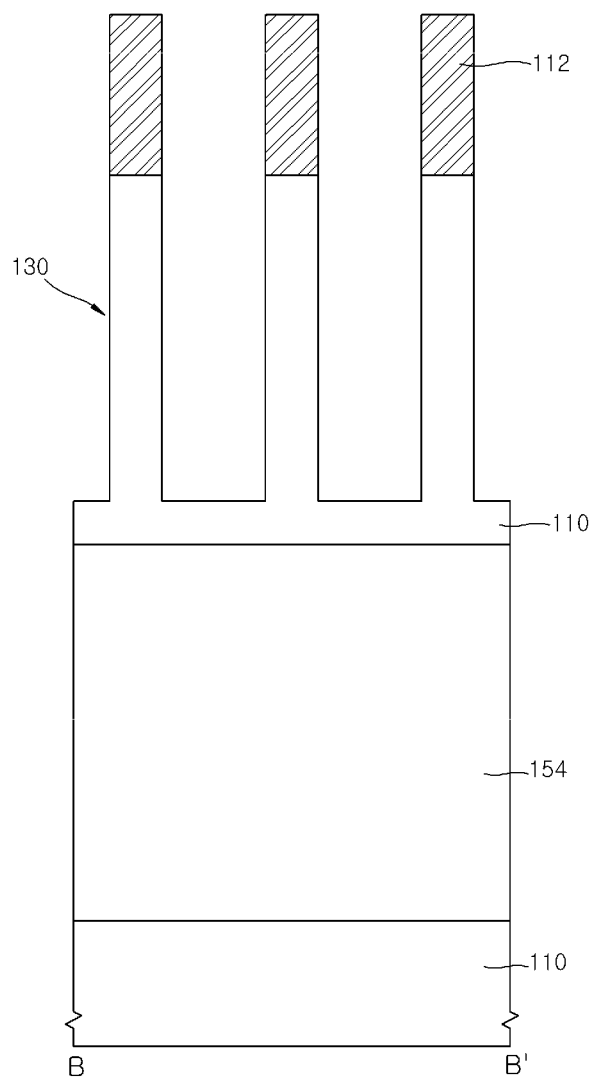

Referring to FIGS. 2 (a block 220), 6A, 6B and 6C, active pillars 130 may be formed on the semiconductor substrate 110. The active pillars 130 may be formed not to overlap with the first capacitors 150 in a plan view. Specifically, the semiconductor substrate 110 including the first capacitors 150 may be partially and anisotropically etched to form the active pillars 130 that relatively protrude from the remaining portion of the substrate. The first capacitors 150 may also be etched during an etch process for forming the active pillars 130. That is, the storage node electrodes 152 and the capacitor dielectric layer 153 may be etched during formation of the active pillars 130. Thus, a height of the first capacitors 150 may be reduced. After the etch process for forming the active pillars 130, the substrate including the active pillars 130 may be cleaned using a first standard cleaning (SC1) solution and a buffer oxide etchant (BOE) to remove contaminants and/or byproducts that remain on a surface of the substrate. The SC1 solution is a chemical solution containing ammonium hydroxide ($NH_4OH$), hydrogen peroxide ($H_2O_2$) and de-ionized water. Accordingly, the active pillars 130 may be formed on the semiconductor substrate 110 between the first capacitors 150, as illustrated in FIG. 6B. As described above, the height of the first capacitors 150 may be determined after the active pillars 130 are formed. After formation of the active pillars 130, a top surface of the plate electrode 154 may be located at a first depth D1 from a top surface of the recessed semiconductor substrate 110 and a bottom surface of the plate electrode 154 may be located at a second depth D2 from the top surface of the recessed semiconductor substrate 110. The first depth D1 may be less than a depth of the first capacitors 150, and the second depth D2 may be greater than the depth of the first capacitors 150.

Figure 7A:
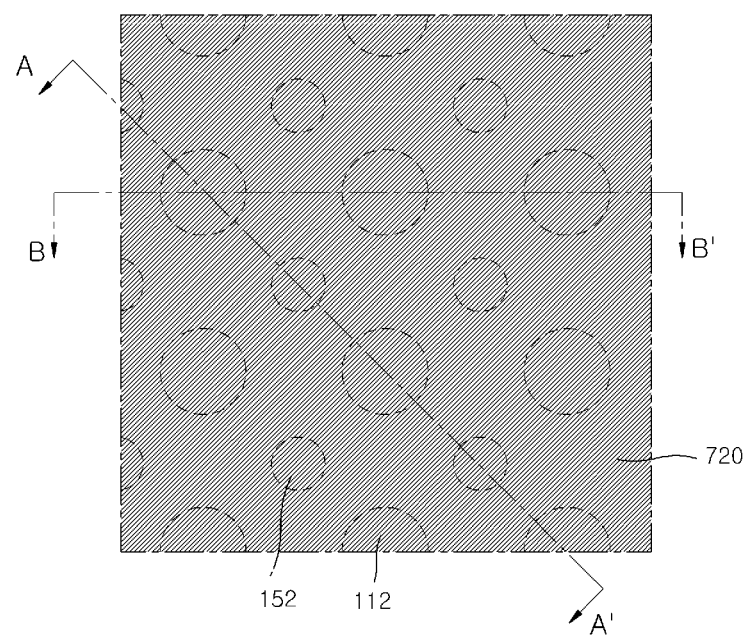
Figure 7B:
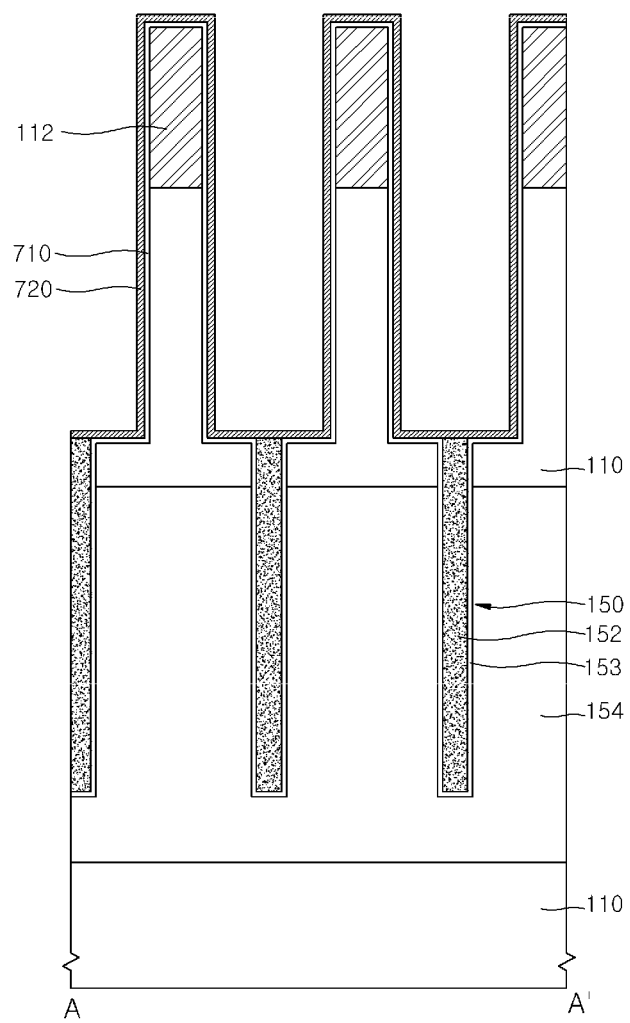
Figure 7C:
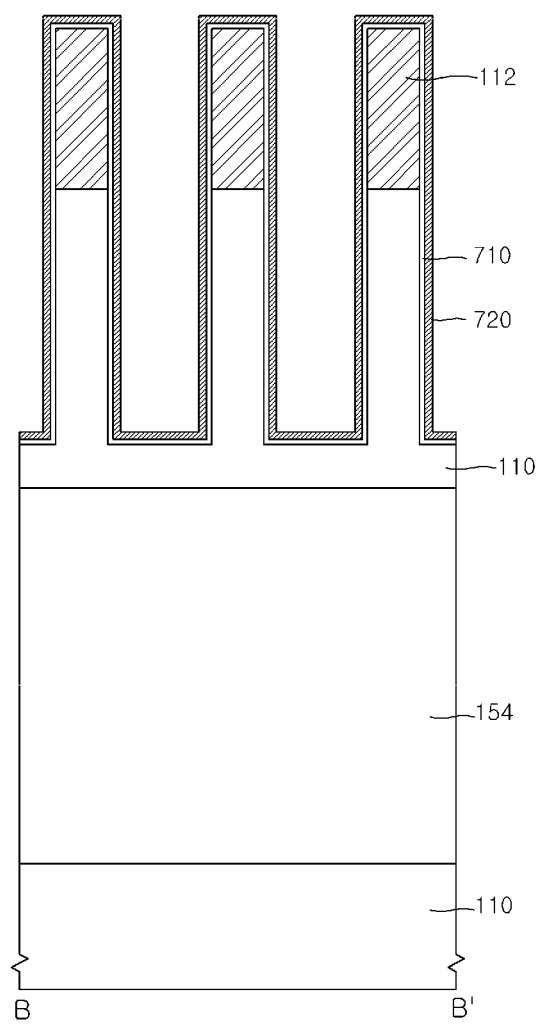

Referring to FIGS. 2 (a block 230), 7A to 12A, 7B to 12B, and 7C to 12C, pillar connection patterns 133 may be formed to electrically connect the storage node electrodes 152 of the first capacitors 150 to first source regions 132 formed in first regions (e.g., lower portions) of the active pillars 130. Specifically, a spacer oxide layer 710 and a spacer nitride layer 720 may be sequentially formed on the substrate including the first capacitors 150 and the active pillars 130, as illustrated in FIGS. 7A, 7B and 7C. The spacer oxide layer 710 and the spacer nitride layer 720 may be formed to conformally cover the top surface of the recessed semiconductor substrate 110, sidewalls of the active pillars 130, and sidewalls and top surfaces of the hard mask pattern 112. The spacer oxide layer 710 and the spacer nitride layer 720 may be formed using a chemical vapor deposition (CVD) process, an atomic layer deposition (ALD) process or an evaporation process.

Figure 8A:
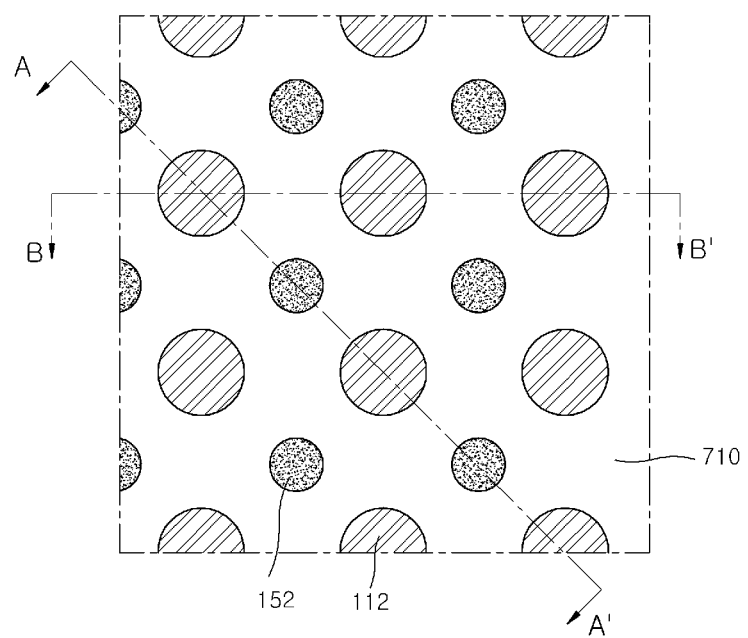
Figure 8B:
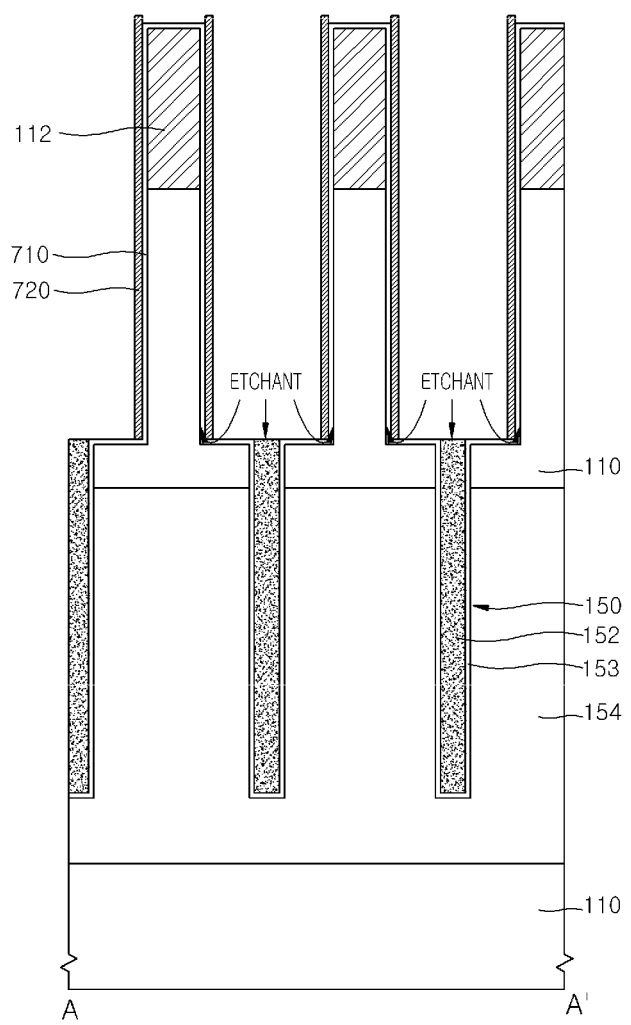
Figure 8C:
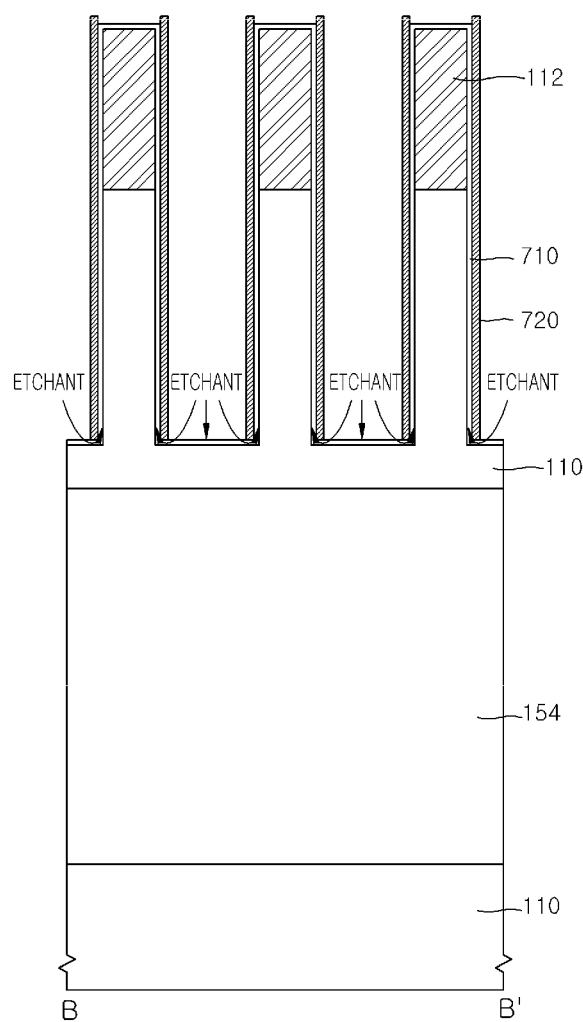
Figure 9A:
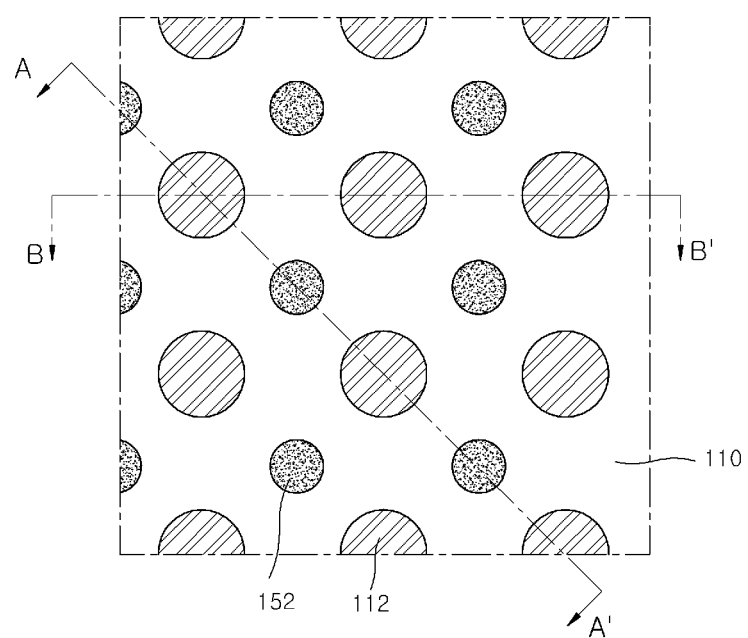
Figure 9B:
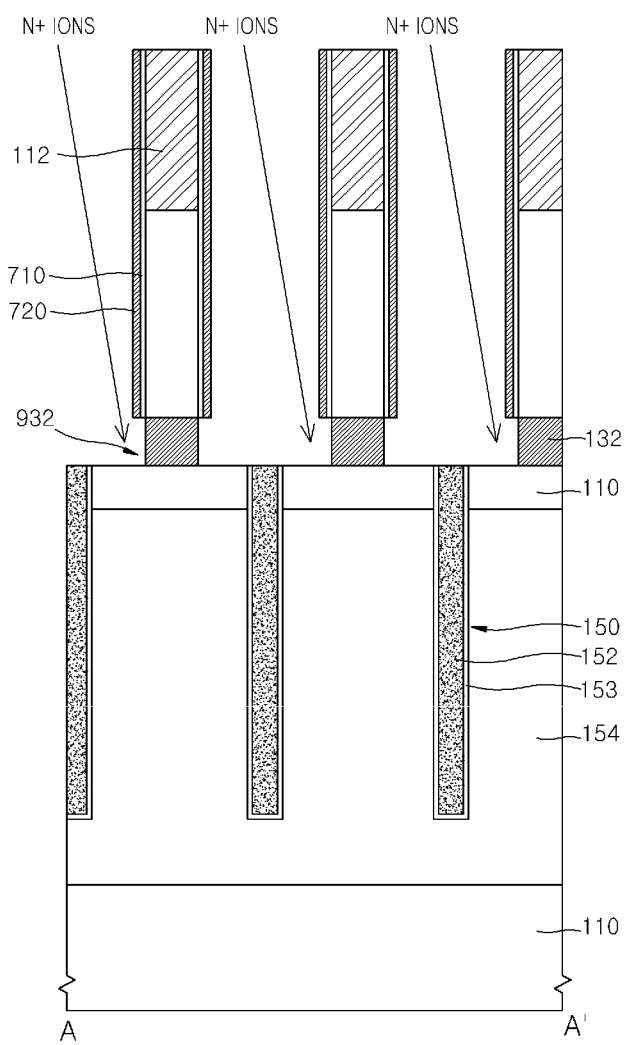
Figure 9C:
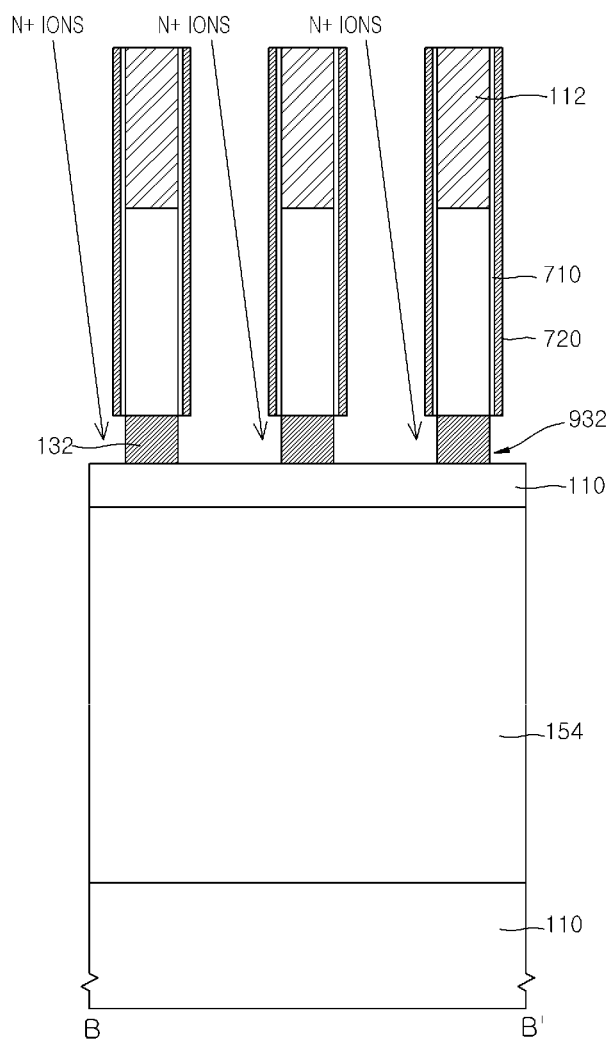

Referring to FIGS. 8A, 8B, 8C, 9A, 9B and 9C, portions of the spacer oxide layer 710 and the spacer nitride layer 720 may be removed to expose the first regions 932 (e.g., the lower portions) of the active pillars 130. According to an example embodiment, the spacer nitride layer 720 may be anisotropically etched to selectively expose the spacer oxide layer 710 on the top surface of the recessed semiconductor substrate 110 and on the top surface of the hard mask pattern 112, as illustrated in FIGS. 8A, 8B and 8C. Subsequently, the exposed spacer oxide layer 710 may be etched using an isotropic etch process. In some embodiments, the isotropic etch process may be performed using a wet etch process. The wet etch process may be performed with a wet etchant, for example, a hydrofluoric acid (HF) solution or a buffered oxide etchant (BOE). As the time elapses during the wet etch process, the exposed spacer oxide layer 710 on the recessed semiconductor substrate 110 may be removed and the spacer oxide layer 710 on the sidewalls of the active pillars 130 may be additionally etched. As a result, the spacer oxide layer 710 on the lower sidewalls of the active pillars 130 may be selectively removed and the spacer nitride layer 720 covering the lower sidewalls of the active pillars 130 may be lifted off. Thus, the first regions 932 of the active pillars 130 may be exposed, as illustrated in FIGS. 9A, 9B and 9C. Exposed areas of the first regions 932 may be controlled by adjusting a wet etch process condition, for example, a concentration of the wet etchant, a wet etch process temperature and/or a wet etch time.

An impurity injection process may be applied to the active pillars 130 to form first source regions 132 in respective ones of the first regions 932. The impurity injection process may be, for example, an ion implantation process or a plasma doping process. In some embodiments, the first source regions 132 may be formed by implanting n-type impurity ions such as phosphorus ions or arsenic ions into the active pillars 130 at a tilted angle with respect to the sidewalls of the active pillars 130. The tilted ion implantation process may be applied to only a portion of a sidewall of each first region 932. In such a case, the first source regions 132 may be formed only at a portion of a sidewall of each first region 932. Alternatively, the tilted ion implantation process may be applied to entire regions of the sidewalls of the first regions 932 by rotating the semiconductor substrate 110 during the tilted ion implantation process. In such a case, the first source regions 132 may be formed to surround the sidewalls of the first regions 932. In some embodiments, the first source regions 132 may be formed using a plasma doping process. The plasma doping process may be performed by generating plasma using an n-type doping gas (e.g., a phosphorus gas or an arsenic gas) as a reaction gas and by doping the first regions 932 with the n-type doping gas. The first source regions 132 may be formed only at the sidewall surfaces of the first regions 932 or even in the bulk regions of the first regions 932.

Figure 10A:
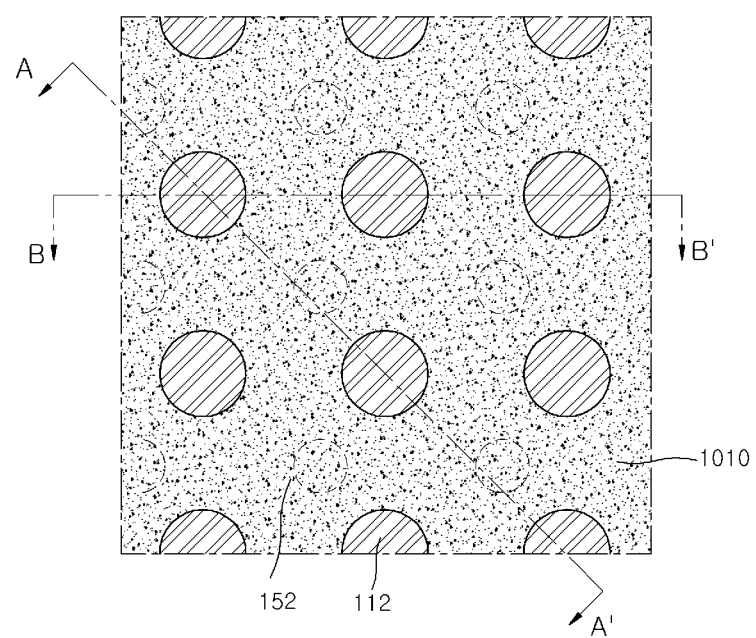
Figure 10B:
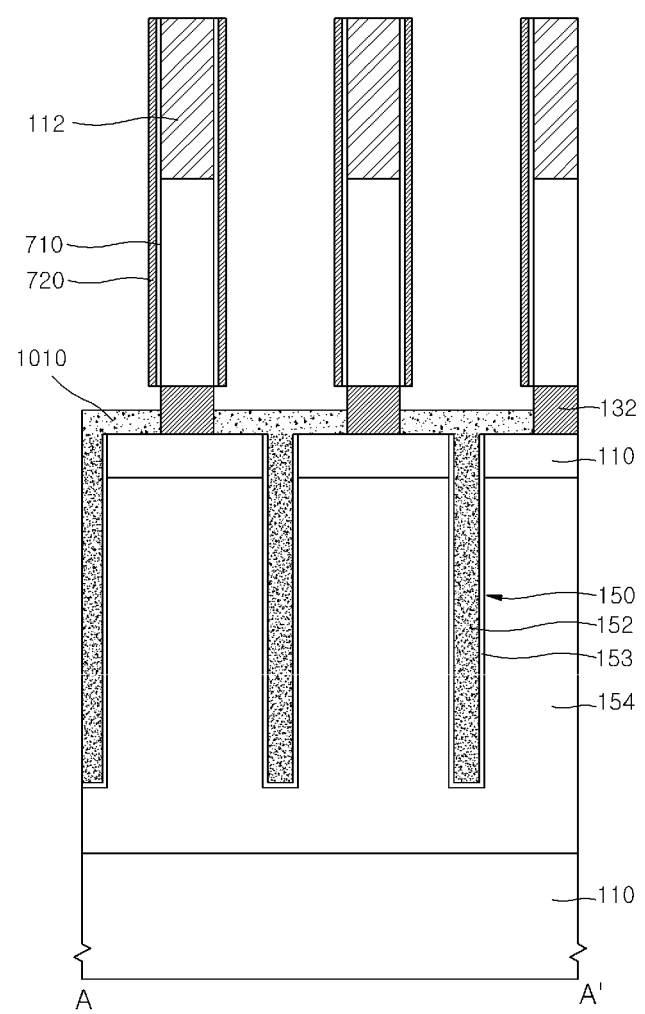
Figure 10C:
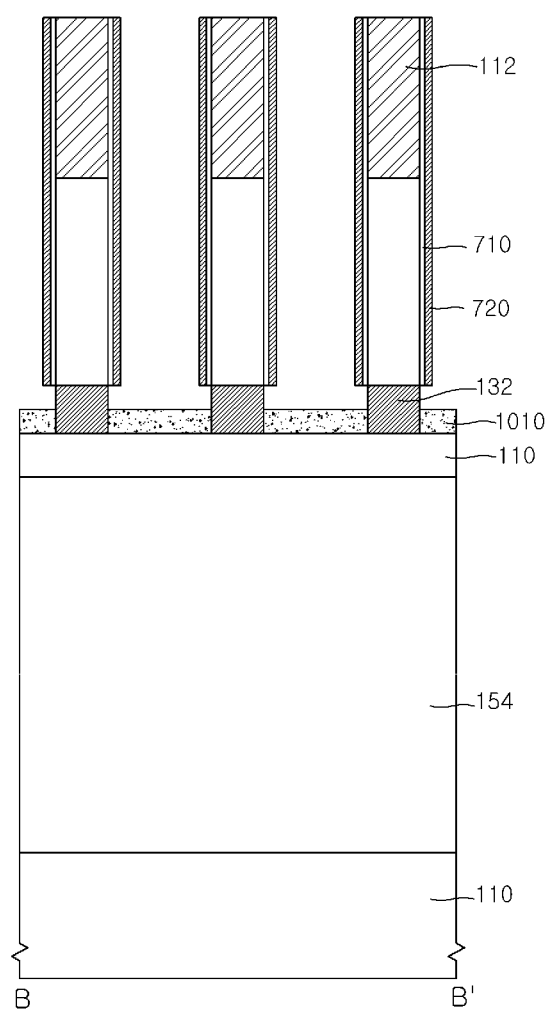

Referring to FIGS. 10A, 10B and 10C, a conductive layer 1010 may be formed on the substrate including the first source regions 132. The conductive layer 1010 may be formed by depositing a conductive material to fill spaces between the active pillars 130 and by recessing the conductive material to have a predetermined thickness (e.g., a predetermined vertical height) which is less than a height of the first source regions 132. The conductive material may be deposited using a chemical vapor deposition (CVD) process, a sputtering process or the like, and the conductive material may be recessed using a wet etching process or a dry etching process. The thickness (e.g., a vertical height) of the conductive layer 1010 may be controlled by some process conditions, for example, a deposition condition and/or an etch condition of the conductive material. The conductive layer 1010 may be formed to include, for example, a doped silicon layer, a metal layer or a metal nitride layer. The metal layer may be a titanium (Ti) layer, a tantalum (Ta) layer, a tungsten (W) layer or a ruthenium (Ru) layer, and the metal nitride layer may be a titanium nitride (TiN) layer, a tantalum nitride (TaN) layer, a tungsten nitride (WN) layer or a ruthenium nitride (Ru N) layer.

Figure 11A:
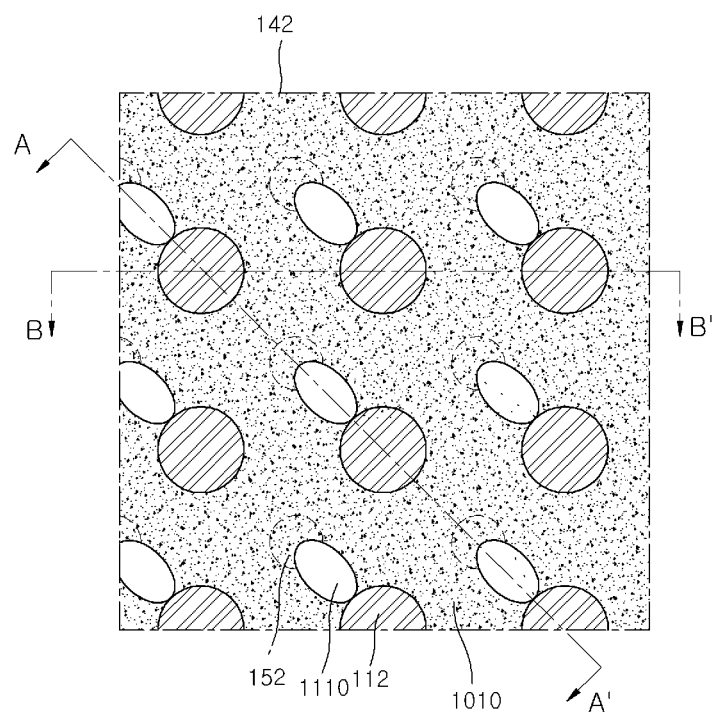
Figure 11B:
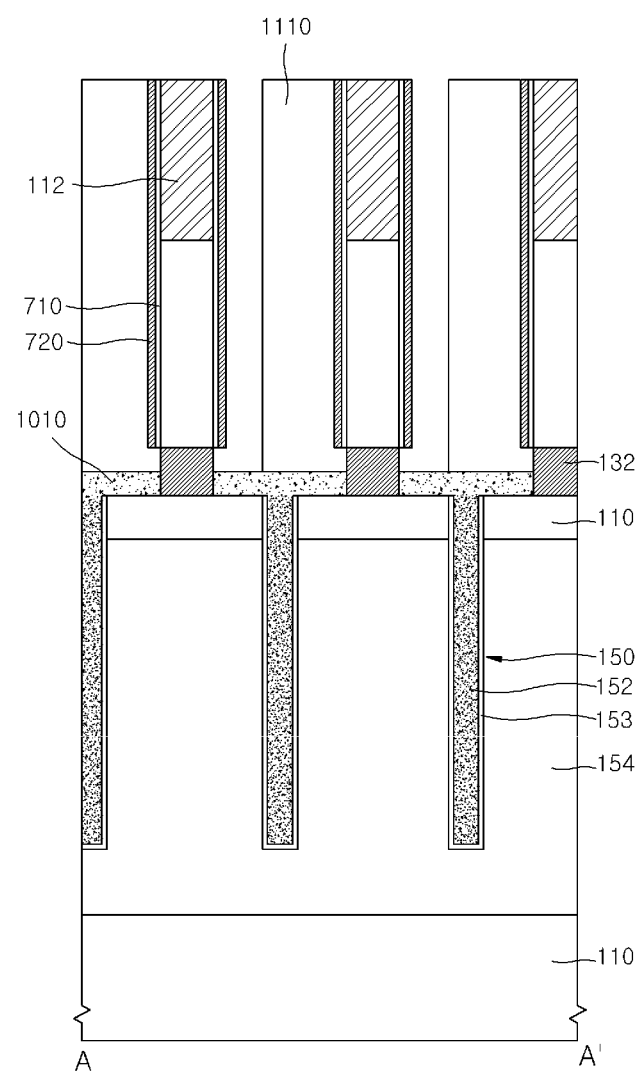
Figure 11C:
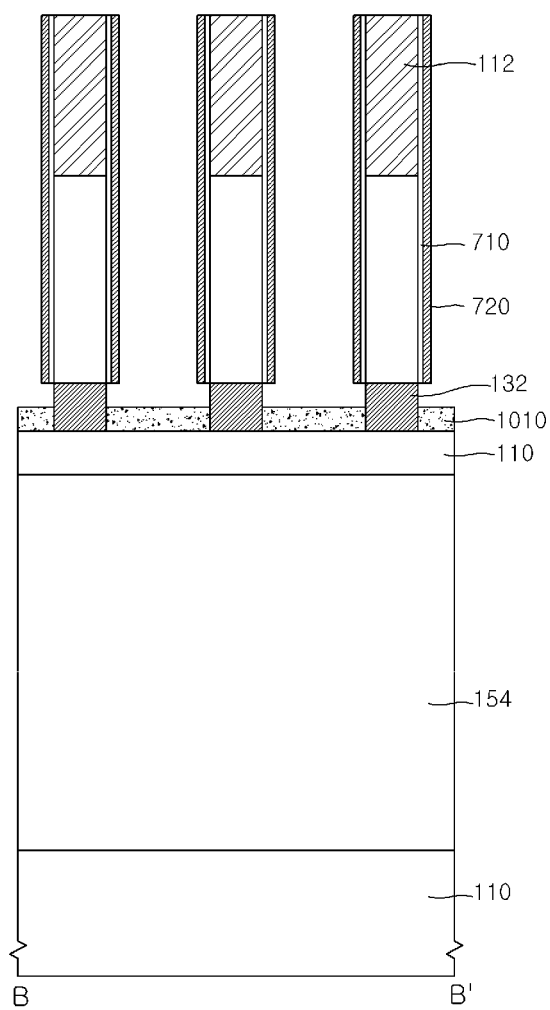

Referring to FIGS. 11A, 11B and 11C, sacrificial layer patterns 1110 may be formed on portions of the conductive layer 1010. Each of the sacrificial layer patterns 1110 may be formed to cover a portion of a sidewall of each active pillar 130 and to overlap with a portion of the conductive layer 1010 between the storage node electrode 152 of the first capacitor 150 and the first source region 132 of the active pillar 130 adjacent thereto in a plan view. The sacrificial layer patterns 1110 may be photoresist patterns, but not limited thereto. For example, the sacrificial layer patterns 1110 may be formed of any material having an etch selectivity with respect to the conductive layer 1010. In some embodiments, forming the sacrificial layer patterns 1110 may include forming a sacrificial layer, forming photoresist patterns on the sacrificial layer, and etching the sacrificial layer using the photoresist patterns as etch masks. The sacrificial layer may be formed of a spin-on-carbon (SOC) material or an oxide material. The sacrificial layer may be formed using a coating process or a chemical vapor deposition (CVD) process and may be etched using a dry etching process or a wet etching process.

Figure 12A:
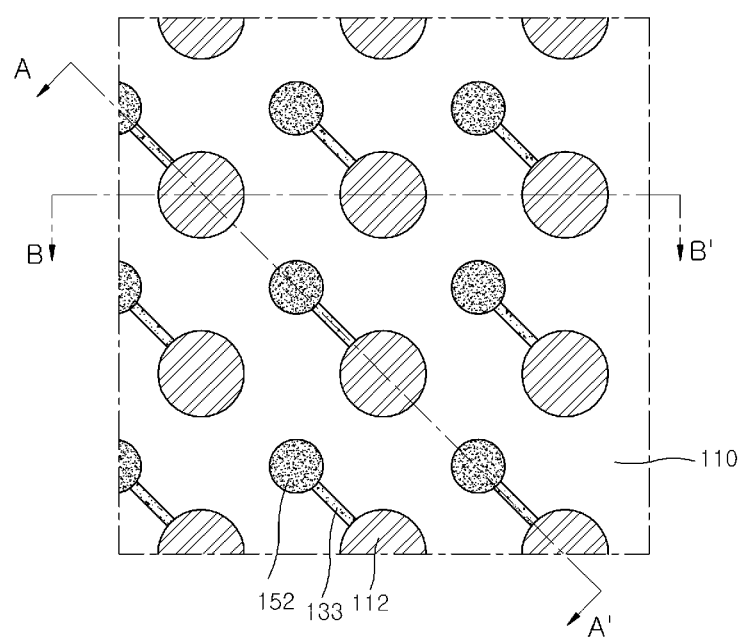
Figure 12B:
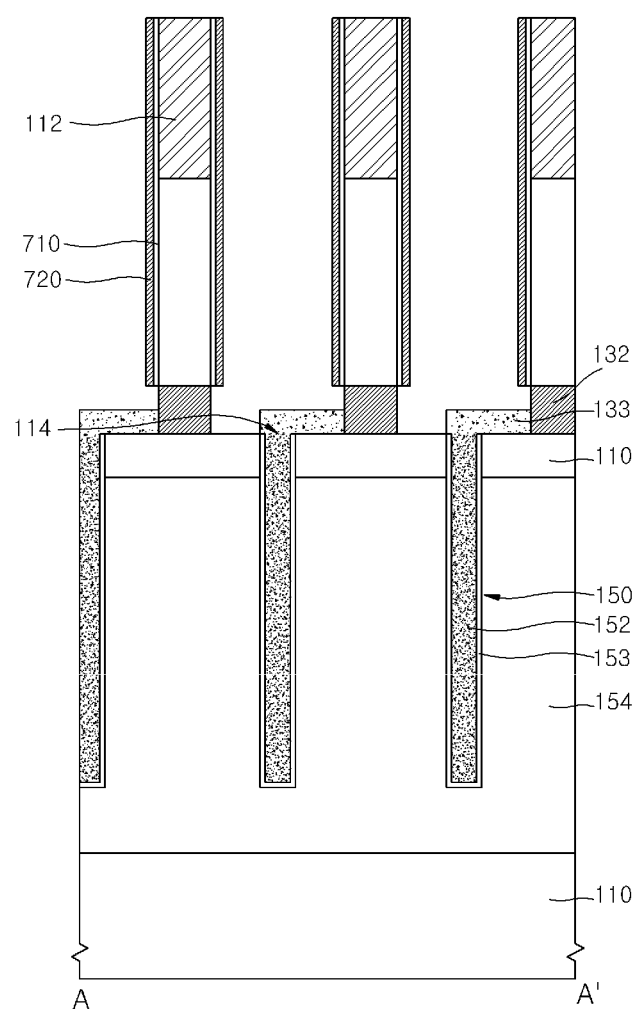
Figure 12C:
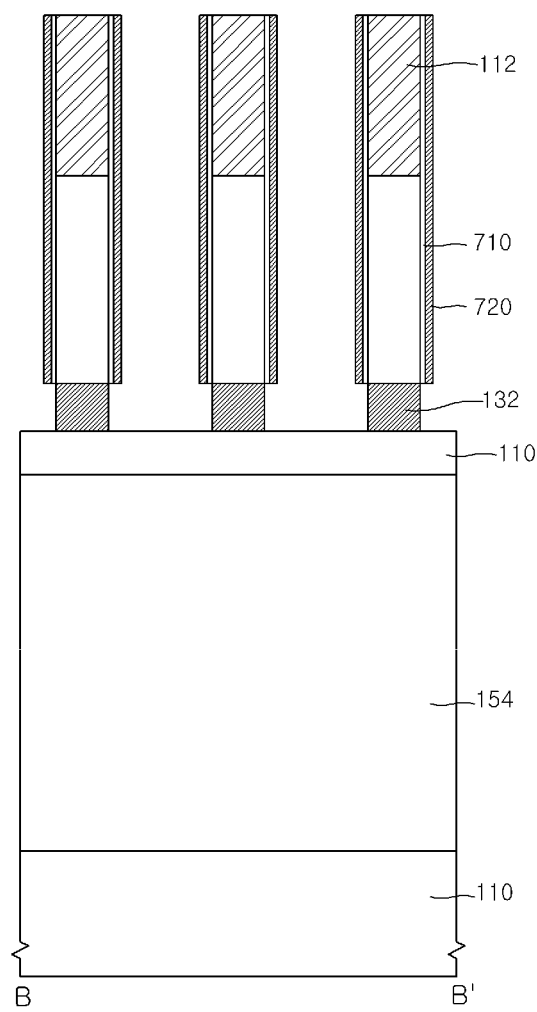

Referring to FIGS. 12A, 12B and 12C, the conductive layer 1010 may be patterned using the sacrificial layer patterns 1110 as etch masks, thereby forming pillar connection patterns 133 that electrically connect the storage node electrodes 152 of the first capacitors 150 to the first source regions 132 of the active pillars 130. As illustrated in FIG. 12A, each of the pillar connection patterns 133 may be formed to have a predetermined line width and to extend along a surface of the semiconductor substrate 110 from a top surface of the storage node electrode 152 toward the first source region 132 of the active pillar 130 adjacent thereto. After the pillar connection patterns 133 are formed, the spacer nitride layer 720 may be removed.

Referring to FIGS. 2 (a block 240), 13A, 13B and 13C, first gate dielectric layers 141 may be formed on respective ones of sidewalls of the active pillars 130 and first gate electrodes 142 may be formed on respective ones of outer sidewalls of the first gate dielectric layers 141 opposite to the active pillars 130. For example, the first gate dielectric layers 141 and the first gate electrodes 142 may be formed to surround first channel regions of the active pillars 130, which are located on the first source regions 132. Specifically, a first interlayer insulation layer 1310 having a predetermined thickness may be formed on the substrate including the pillar connection patterns 133. The predetermined thickness of the first interlayer insulation layer 1310 may be determined in consideration of a vertical height of the first source regions 132. For example, the first interlayer insulation layer 1310 may be formed to cover the first source regions 132 and the pillar connection patterns 133.

Figure 13A:
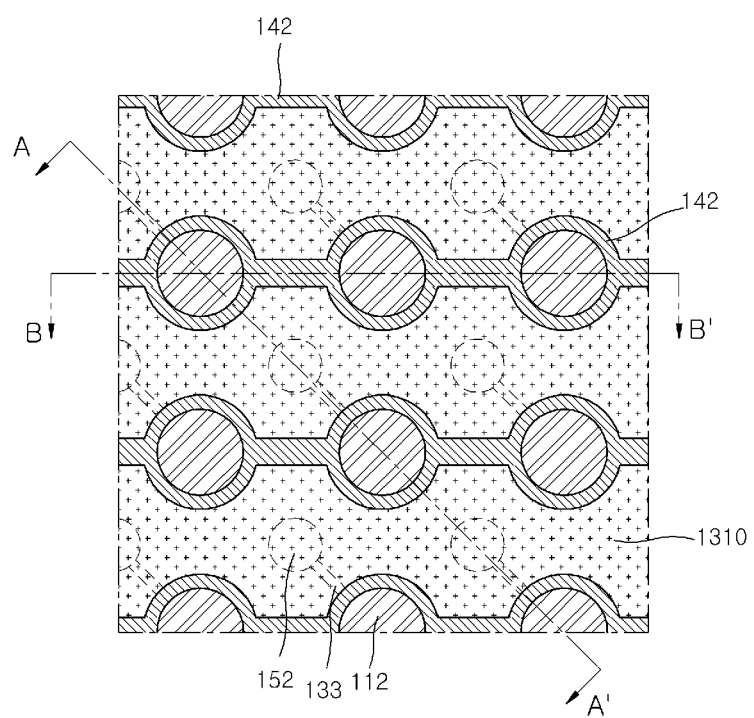
Figure 13B:
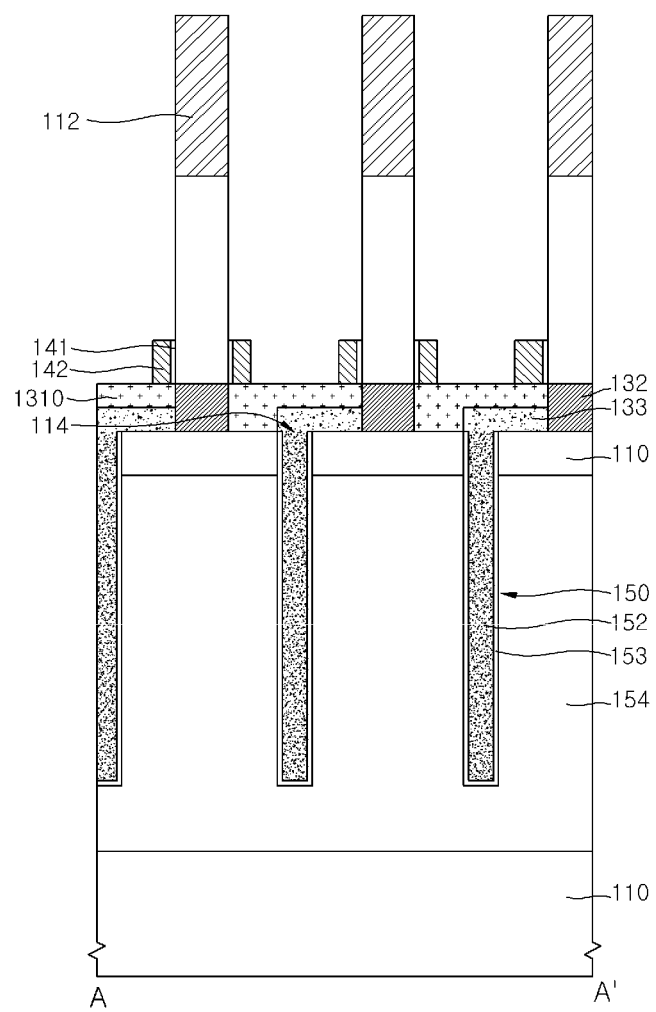
Figure 13C:
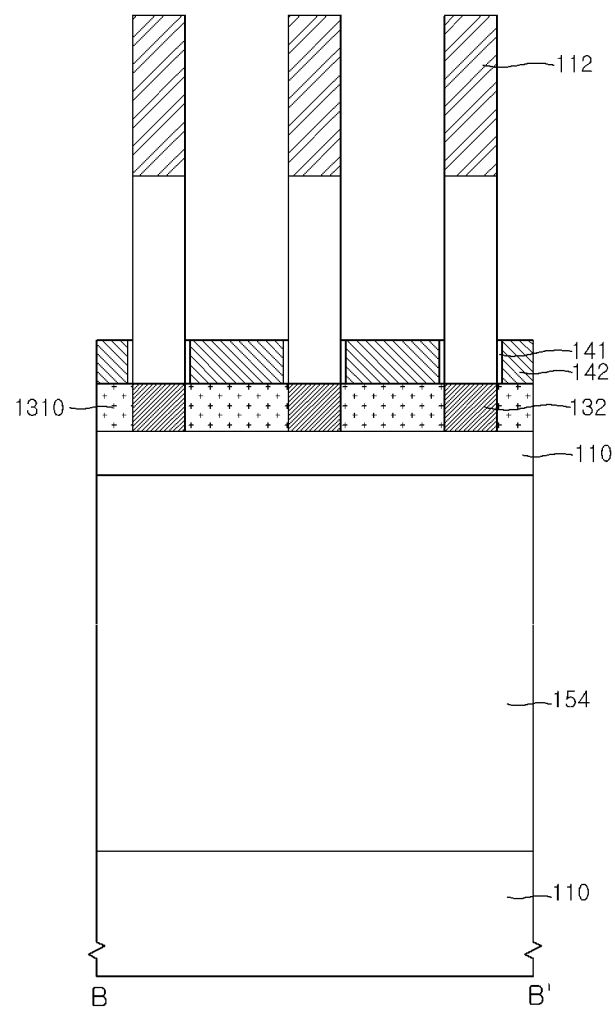

The active pillars 130 may then be oxidized to form a dielectric layer on the sidewalls of the active pillars 130 over the first source regions 132. Subsequently, a conductive layer having a predetermined vertical thickness may be formed on the first interlayer insulation layer 1310, and the conductive layer may then be patterned to form first gate electrodes 142 that surround the first channel regions of the active pillars 130 and extend in one direction. The conductive layer having the predetermined vertical thickness may be formed by depositing a conductive material on the first interlayer insulation layer 1310 and by recessing the conductive material, and the conductive layer may be patterned to form the first gate electrodes 142 extending in one direction as illustrated in FIG. 13A. Further, the dielectric layers between the first gate electrodes 142 and the active pillars 130 may correspond to the first gate dielectric layers 141. A vertical height of the first gate electrodes 142 may be determined in consideration of a length of channel layers (e.g., the first channel regions) which are modulated or controlled by the first gate electrodes 142. The first gate electrodes 142 may be formed to include, for example, a doped silicon layer, a metal layer or a metal nitride layer. The metal layer may be a titanium (Ti) layer, a tantalum (Ta) layer, a tungsten (W) layer or a ruthenium (Ru) layer, and the metal nitride layer may be a titanium nitride (TiN) layer, a tantalum nitride (TaN) layer, a tungsten nitride (WN) layer or a ruthenium nitride (RuN) layer. The conductive material for forming the first gate electrodes 142 may be deposited using a chemical vapor deposition (CVD) process, a sputtering process, an evaporation process or the like.

In some embodiments, a channel ion implantation process may be applied to the first channel regions of the active pillars 130 before the dielectric layer is formed on sidewalls of the active pillars 130. Impurity ions injected by the channel ion implantation process may have an opposite conductivity type to the first source regions 132. For example, when the first source regions 132 have an n-type, Impurity ions injected by the channel ion implantation process may have a p-type. The channel ion implantation process may be performed to adjust a threshold voltage of vertical transistors including the first gate electrodes 142.

Referring to FIGS. 2 (a block 250), 14A and 15A, 14B and 15B, and 14C and 15C, common drain regions 134 may be formed in respective ones of second regions of the active pillars 130 which are located over the first channel regions, and common bit lines 122 may be formed to surround sidewalls of the common drain regions 134. Specifically, referring to FIGS. 14A, 14B and 14C, a second interlayer insulation layer 1410 having a predetermined vertical height may be formed on the first interlayer insulation layer 1310. The predetermined vertical height of the second interlayer insulation layer 1410 may be determined in consideration of the heights of the first gate electrodes 142 and the common drain regions 134. For example, the second interlayer insulation layer 1410 may be formed to cover the first gate electrodes 142 and to expose the second regions 1434 of the active pillars 130.

Subsequently, an impurity injection process may be applied to the second regions 1434 of the active pillars 130 to form common drain regions 134 in respective ones of the second regions 1434. The common drain regions 134 may be formed to have the same conductivity type as the first source regions 132. That is, when the first source regions 132 are formed to have an n-type, the common drain regions 134 may also be formed to have an n-type. The impurity injection process for forming the common drain regions 134 may be, for example, an ion implantation process or a plasma doping process. In some embodiments, the common drain regions 134 may be formed by implanting n-type impurity ions such as phosphorus ions or arsenic ions into the second regions 1434 of the active pillars 130 at a tilted angle with respect to the sidewalls of the active pillars 130. Each of the common drain regions 134 may be formed only at a portion of a sidewall of each second region 1434 or at an entire sidewall of each second region 1434. In some embodiments, the common drain regions 134 may be formed using a plasma doping process. The plasma doping process may be performed by generating plasma using an n-type doping gas (e.g., a phosphorus gas or an arsenic gas) as a reaction gas and by doping the second regions 1434 with the n-type doping gas. The common drain regions 134 may be formed only at the sidewall surfaces of the second regions 1434 or even in the bulk regions of the second regions 1434.

Figure 15A:
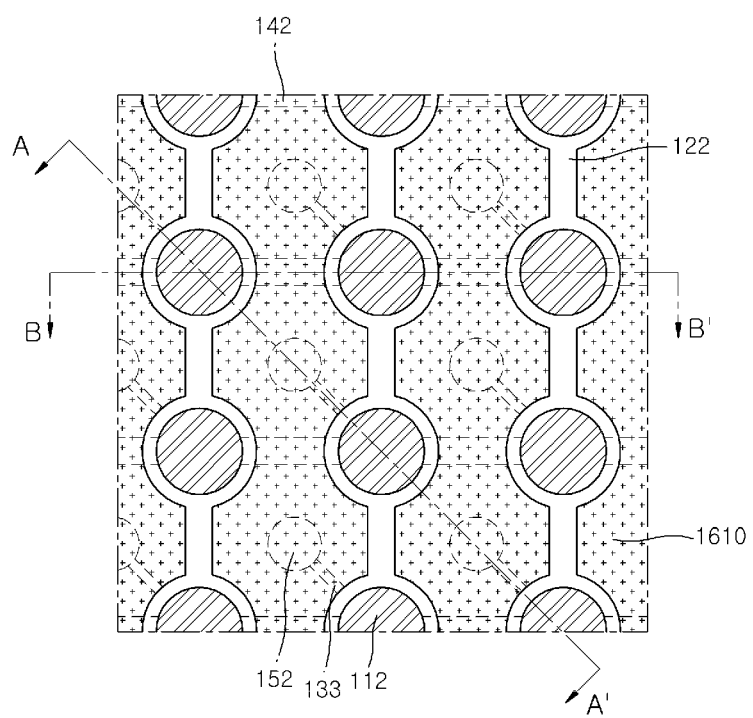
Figure 15B:
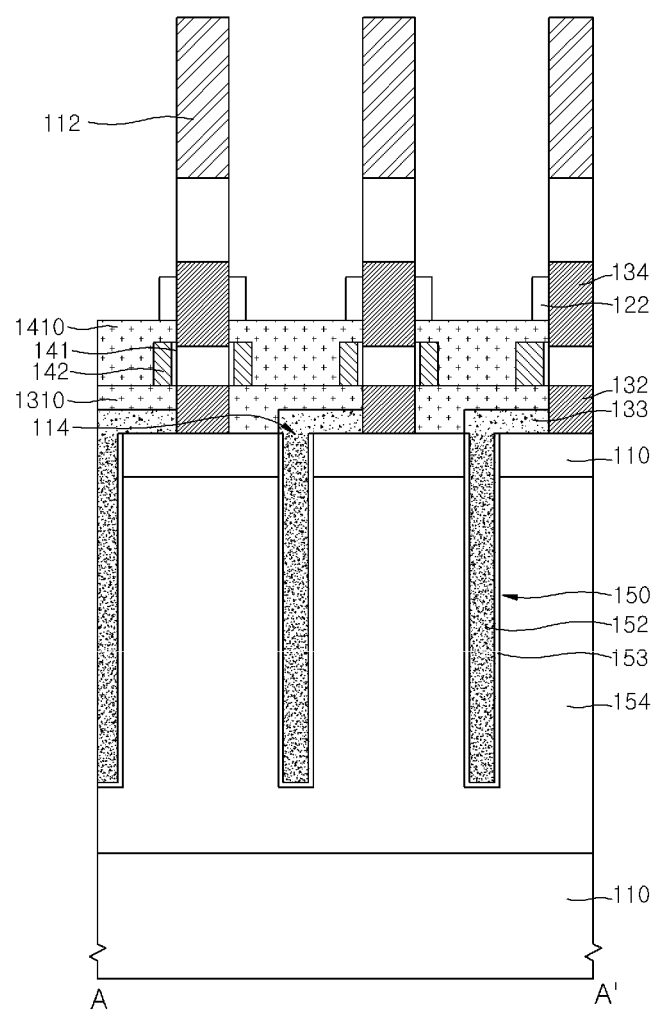
Figure 15C:
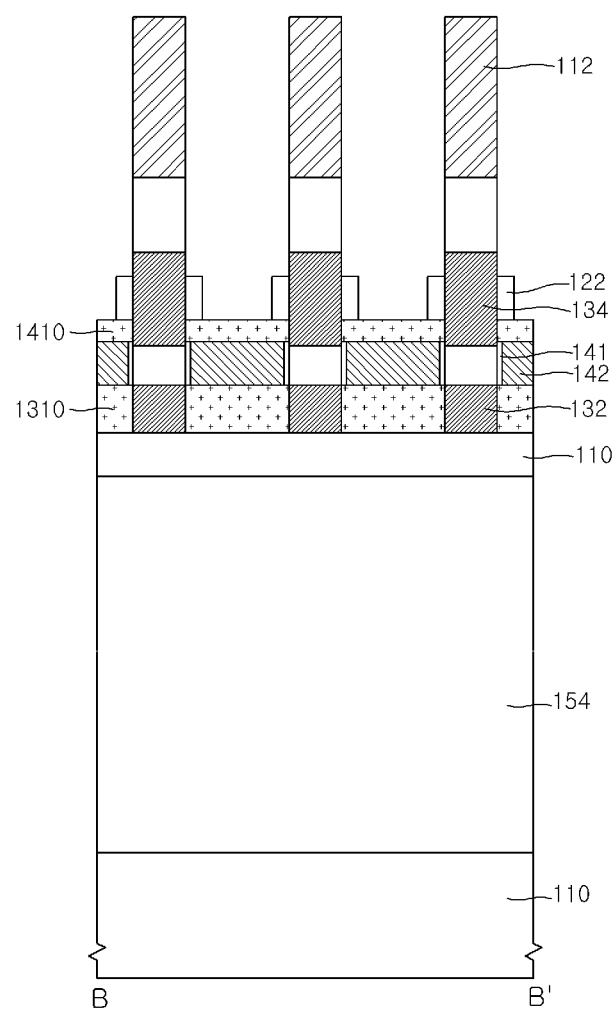

Referring to FIGS. 15A, 15B and 15C, a conductive layer having a predetermined thickness (e.g., a predetermined vertical height) may be formed on the second interlayer insulation layer 1410, and the conductive layer may be patterned to form the common bit lines 122 surrounding sidewalls of the common drain regions 134 and extending in one direction. Specifically, the conductive layer having the predetermined thickness may be formed by depositing a conductive material on the second interlayer insulation layer 1410 and by recessing the conductive material. Subsequently, the conductive layer may be patterned to form the common bit lines 122 that extend in one direction to have line shapes, as illustrated in FIG. 15A. The common bit lines 122 may be formed to intersect the first gate electrodes 142 when viewed from a plan view. In some embodiments, the common bit lines 122 may be arrayed to cross the first gate electrodes 142 at right angles in plan view. A vertical height of the common bit lines 122 may be determined in consideration of a vertical height of the common drain regions 134. The common bit lines 122 may be formed to include, for example, a doped silicon layer, a metal layer or a metal nitride layer. The metal layer may include a titanium (Ti) layer, a tantalum (Ta) layer, a tungsten (W) layer or a ruthenium (Ru) layer, and the metal nitride layer may include a titanium nitride (TiN) layer, a tantalum nitride (TaN) layer, a tungsten nitride (WN) layer or a ruthenium nitride (RuN) layer. The conductive material for forming the common bit lines 122 may be deposited using a chemical vapor deposition (CVD) process, a sputtering process, an evaporation process or the like.

Figure 14A:
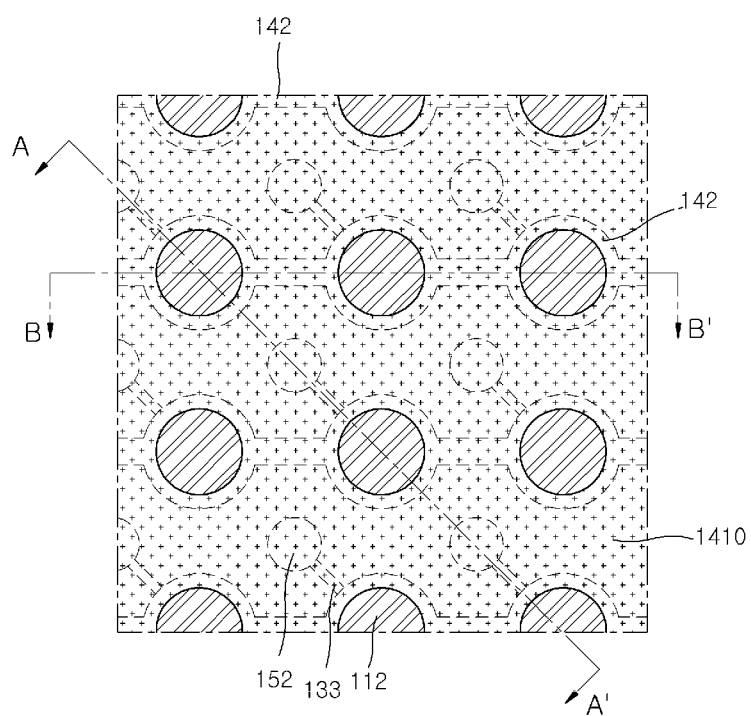
Figure 14B:
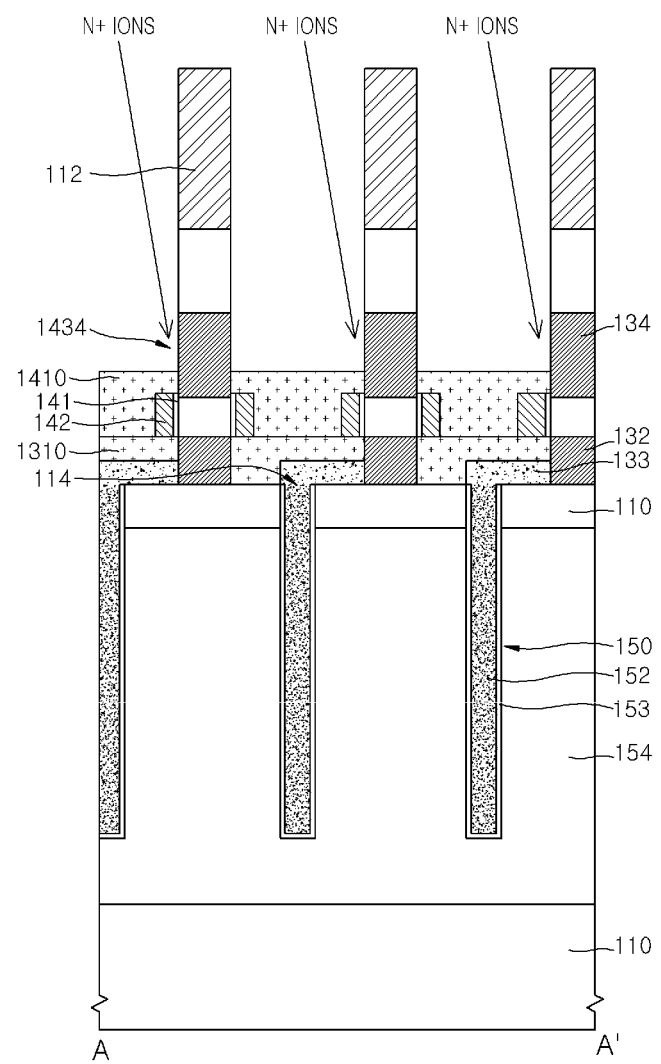
Figure 14C:
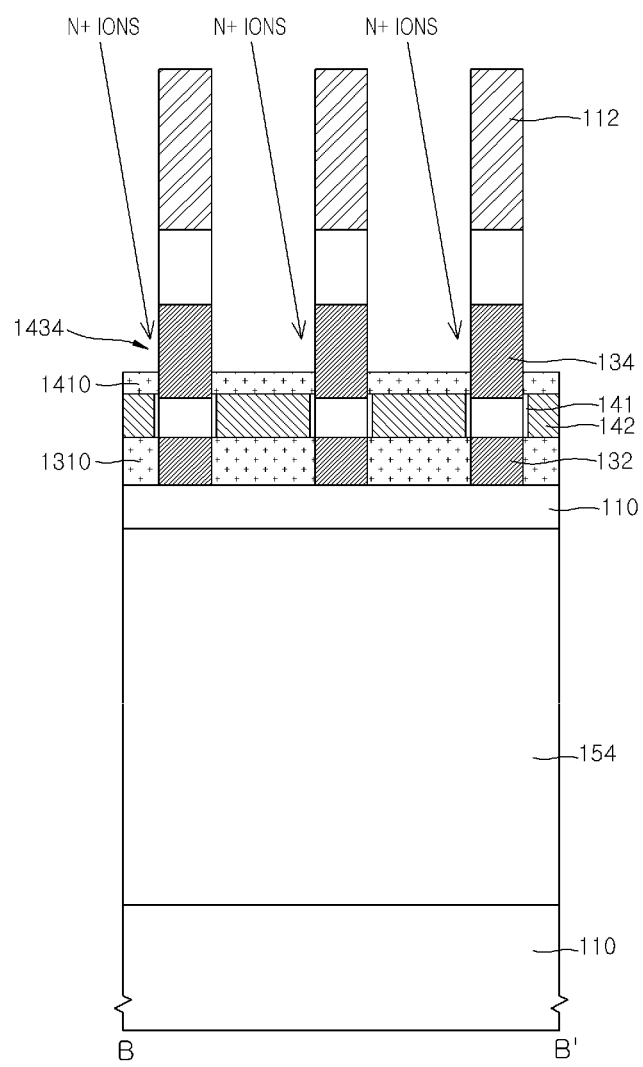

According to some embodiments, the dielectric layer formed on the active pillars 130 to form the first gate dielectric layers 141 may be removed prior to formation of the common drain regions 134 shown in FIGS. 14A, 14B and 14C or prior to formation of the common bit lines 122 shown in FIGS. 15A, 15B and 15C.

Referring to FIGS. 2 (a block 260), 16A, 16B and 16C, second gate dielectric layers 161 may be formed on respective ones of sidewalls of the active pillars 130 and second gate electrodes 162 may be formed on respective ones of outer sidewalls of the second gate dielectric layers 161 opposite to the active pillars 130. For example, the second gate dielectric layers 161 and the second gate electrodes 162 may be formed to surround second channel regions of the active pillars 130, which are located on the common drain regions 134. Specifically, referring to FIGS. 16A, 16B and 16C, a third interlayer insulation layer 1610 having a predetermined thickness may be formed on the substrate including the common bit lines 122. The predetermined thickness of the third interlayer insulation layer 1610 may be determined in consideration of a vertical height of the common drain regions 134. For example, the third interlayer insulation layer 1610 may be formed to cover the second interlayer insulation layer 1410, the common bit lines 122 and the common drain regions 134.

Figure 16A:
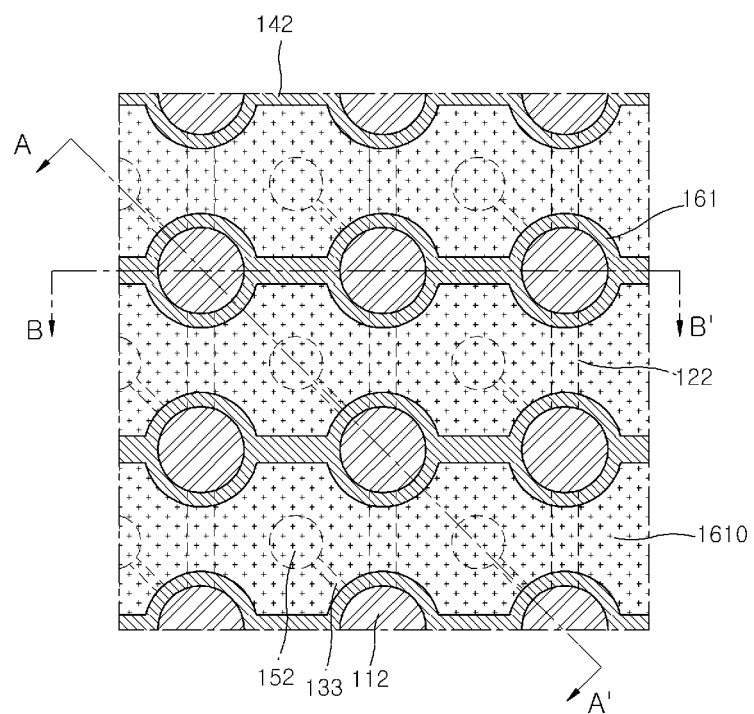
Figure 16B:
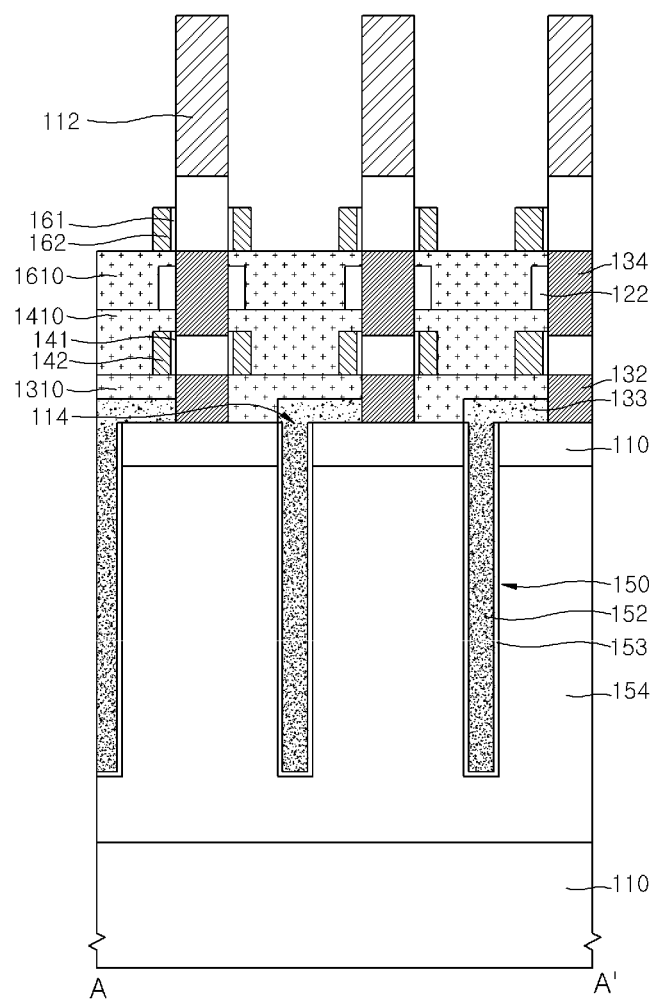
Figure 16C:
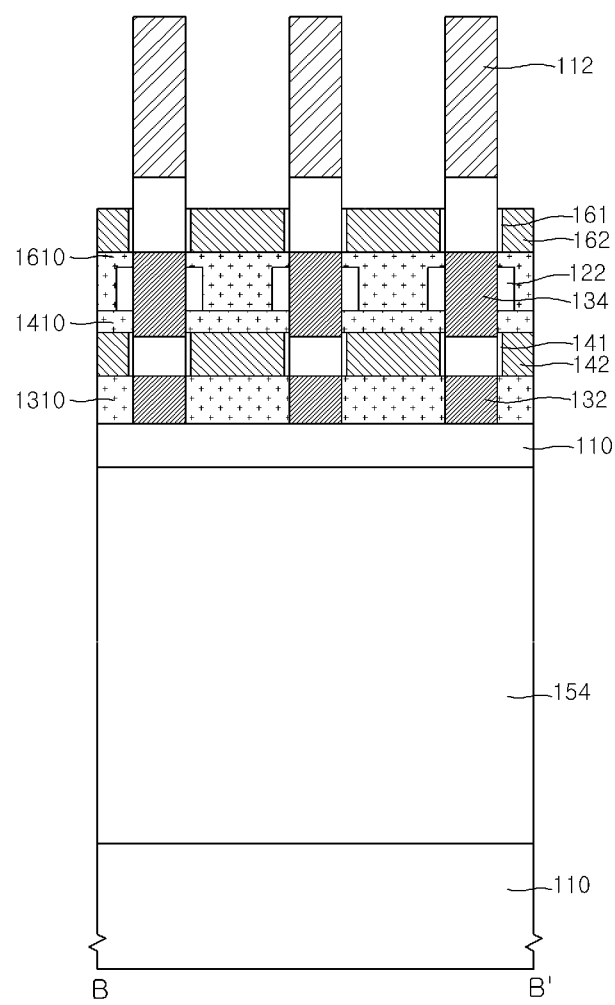
Figure 17A:
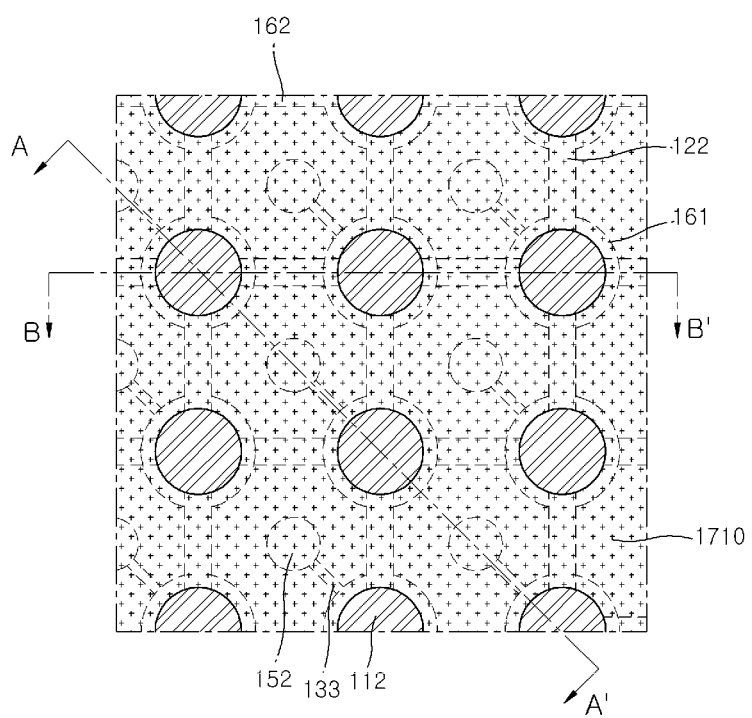
Figure 17B:
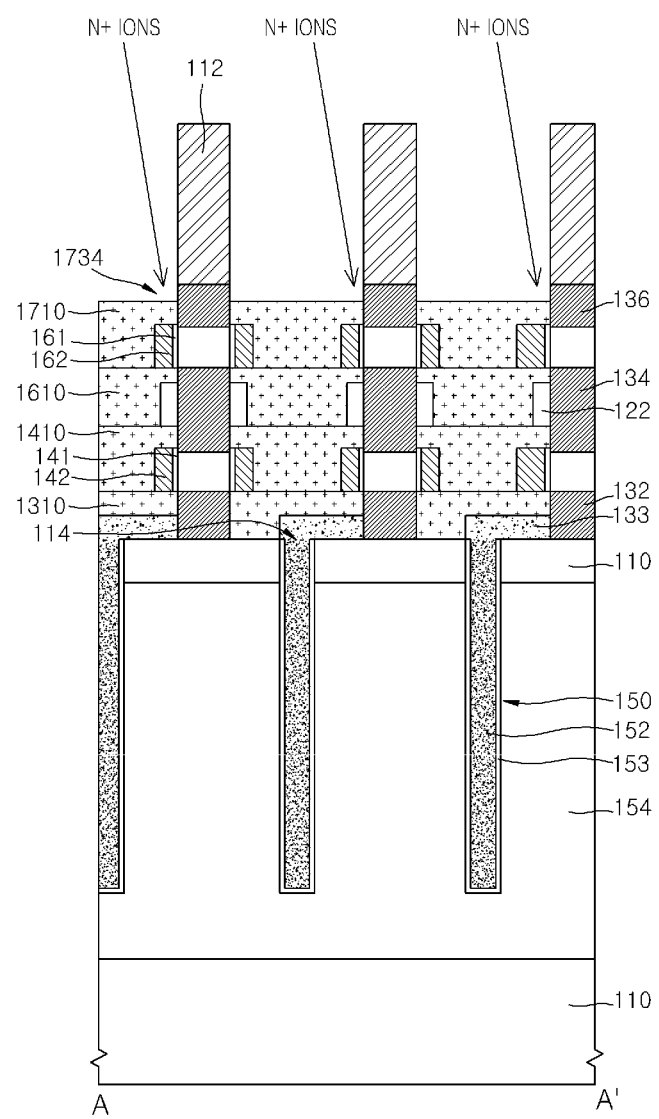
Figure 17C:
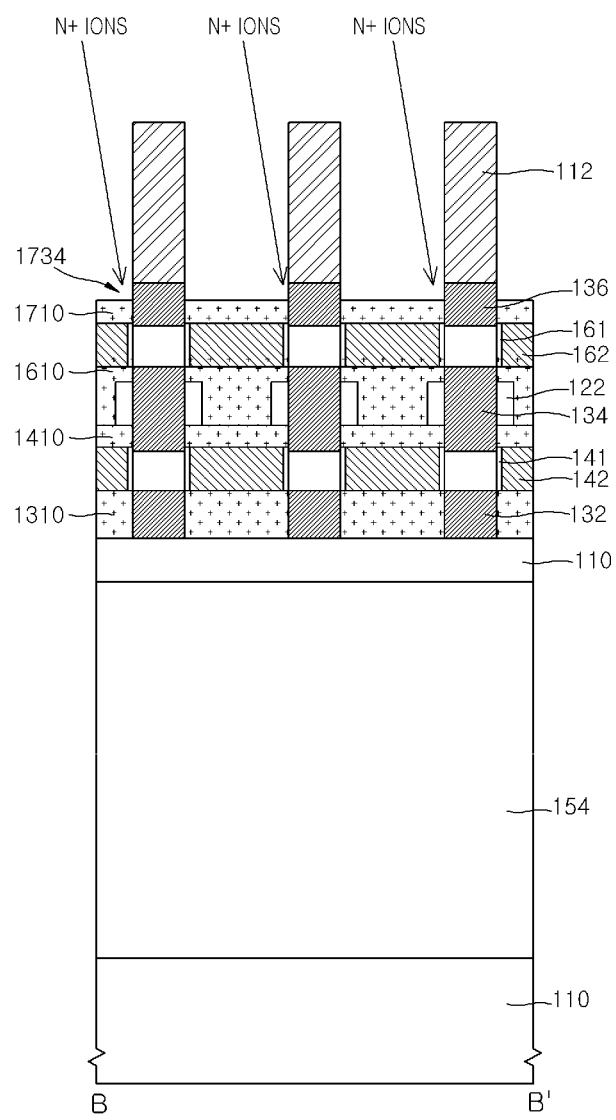
Figure 18A:
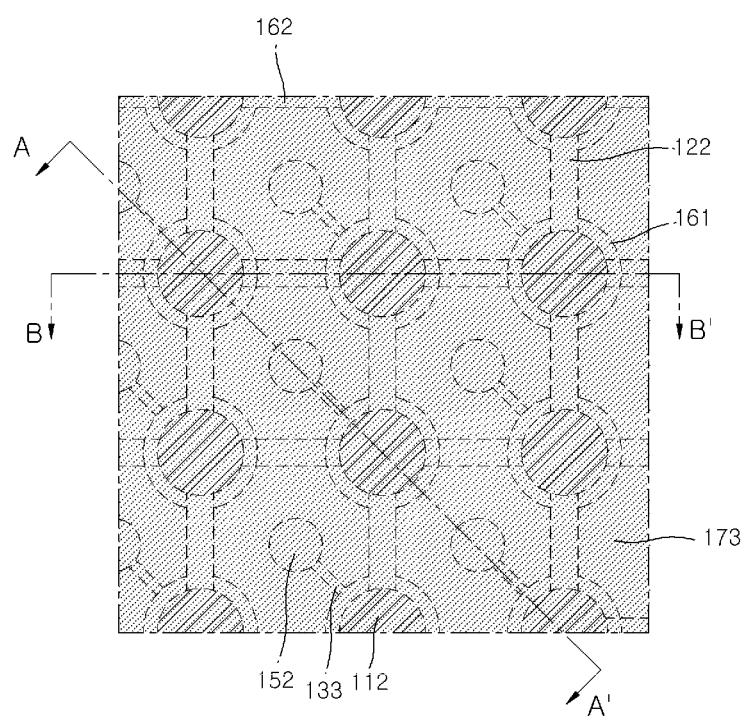
Figure 18B:
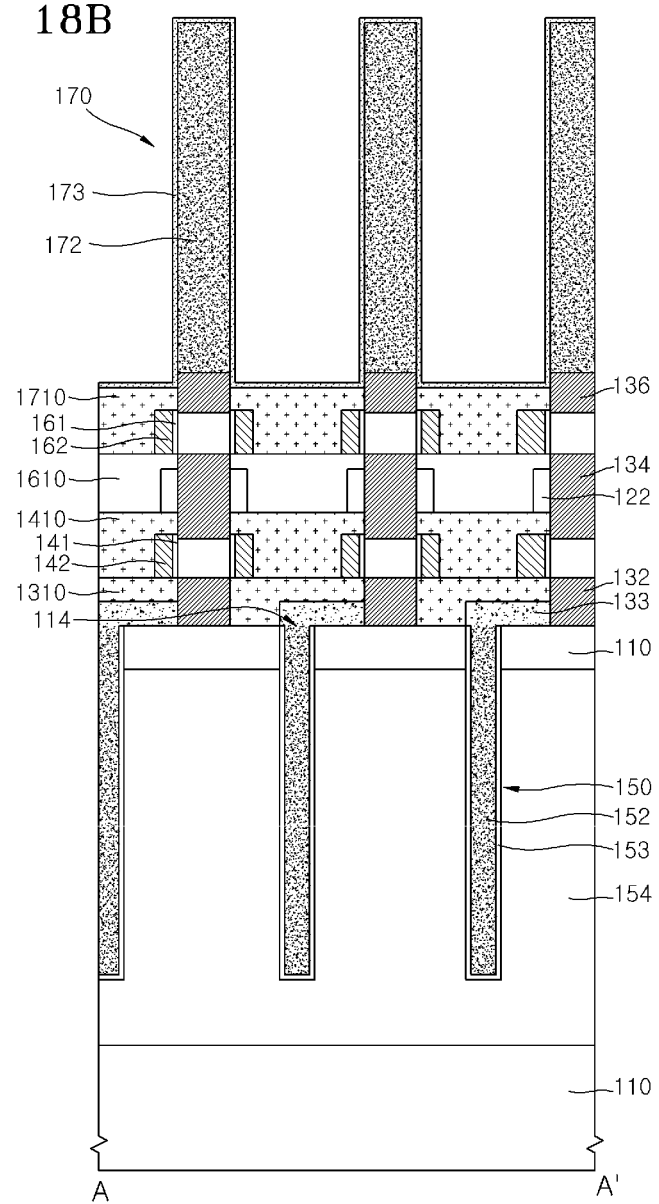
Figure 18C:
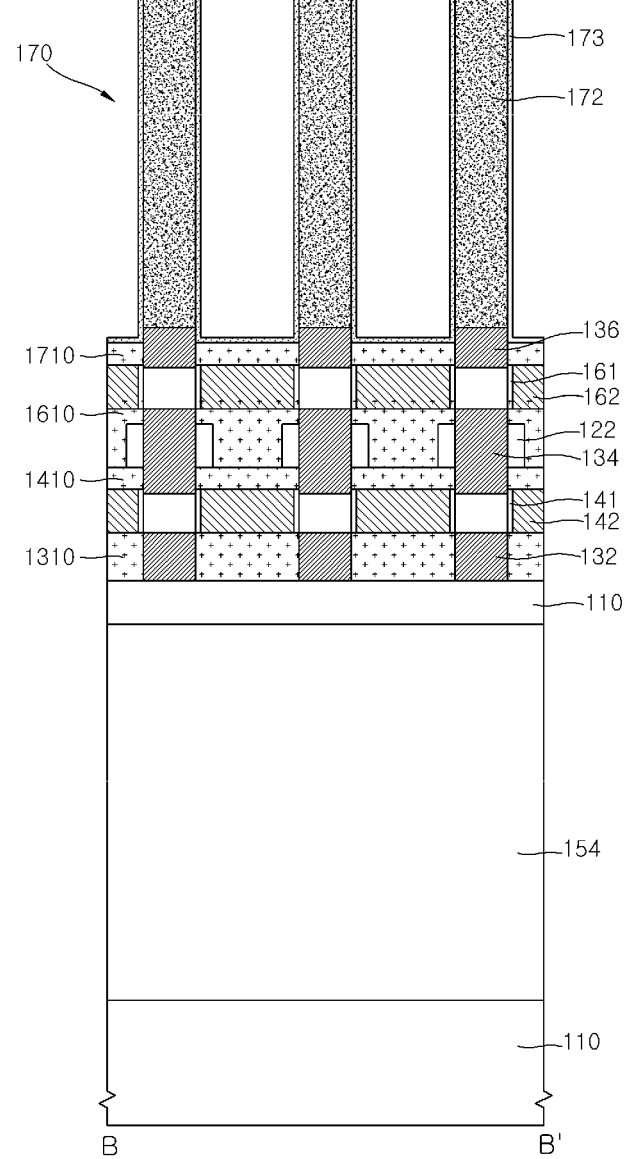

The active pillars 130 may then be oxidized to form a dielectric layer on the sidewalls of the active pillars 130 over the common drain regions 134. Subsequently, a conductive material may be formed on the third interlayer insulation layer 1610, and the conductive material may be recessed to form a conductive layer having a predetermined thickness. The conductive layer may then be patterned to form second gate electrodes 162 that surround the second channel regions of the active pillars 130 and extend in one direction. As a result, the second gate electrodes 162 may be formed to have line shapes, as illustrated in FIG. 16A. The dielectric layers between the second gate electrodes 162 and the active pillars 130 may correspond to the second gate dielectric layers 161. The second gate electrodes 162 may extend in the same direction as the first gate electrodes 142 and may be perpendicular to the common bit lines 122 in a plan view. A vertical height of the second gate electrodes 162 may be determined in consideration of a length of channel layers (e.g., the second channel regions) which are modulated or controlled by the second gate electrodes 162. The second gate electrodes 162 may be formed to include, for example, a doped silicon layer, a metal layer or a metal nitride layer. The metal layer may be a titanium (Ti) layer, a tantalum (Ta) layer, a tungsten (W) layer or a ruthenium (Ru) layer, and the metal nitride layer may be a titanium nitride (TiN) layer, a tantalum nitride (TaN) layer, a tungsten nitride (WN) layer or a ruthenium nitride (RuN) layer. The conductive material for forming the second gate electrodes 162 may be deposited using a chemical vapor deposition (CVD) process, a sputtering process, an evaporation process or the like.

In some embodiments, a channel ion implantation process may be applied to the second channel regions of the active pillars 130 before the dielectric layer is formed on sidewalls of the active pillars 130. Impurity ions injected by the channel ion implantation process may have an opposite conductivity type to the common drain regions 134. For example, when the common drain regions 134 have an n-type, Impurity ions injected by the channel ion implantation process may have a p-type. The channel ion implantation process may be performed to adjust a threshold voltage of vertical transistors including the second gate electrodes 162.

Referring to FIG. 2 (a block 270), 17A, 17B and 17C, second source regions 136 may be formed in respective ones of third regions 1734 (e.g., topmost regions) of the active pillars 130 which are located over the second channel regions surrounded by the second gate electrodes 162. Specifically, a fourth interlayer insulation layer 1710 having a predetermined vertical height may be formed on the third interlayer insulation layer 1610. The predetermined vertical height of the fourth interlayer insulation layer 1710 may be determined in consideration of the heights of the second gate electrodes 162. For example, the fourth interlayer insulation layer 1710 may be formed to cover the second gate electrodes 162 and to expose the third regions 1734 of the active pillars 130.

Subsequently, an impurity injection process may be applied to the third regions 1734 of the active pillars 130 to form the second source regions 136 in respective ones of the third regions 1734. The second source regions 136 may be formed to have the same conductivity type as the first source regions 132. That is, when the first source regions 132 are formed to have an n-type, the second source regions 136 may also be formed to have an n-type. The impurity injection process for forming the second source regions 136 may be, for example, an ion implantation process or a plasma doping process. In some embodiments, the second source regions 136 may be formed by implanting n-type impurity ions such as phosphorus ions or arsenic ions into the third regions 1734 of the active pillars 130 at a tilted angle with respect to the sidewalls of the active pillars 130. Each of the second source regions 136 may be formed only at a portion of a sidewall of each third region 1734. Alternatively, each of the second source regions 136 may be formed at an entire sidewall of each third region 1734 by rotating the semiconductor substrate 110 during the tilted ion implantation process. In some embodiments, the second source regions 136 may be formed using a plasma doping process. The plasma doping process may be performed by generating plasma using an n-type doping gas (e.g., a phosphorus gas or an arsenic gas) as a reaction gas and by doping the third regions 1734 with the n-type doping gas. The second source regions 136 may be formed only at the sidewall surfaces of the third regions 1734 or even in the bulk regions of the third regions 1734.

According to some embodiments, in the event that the active pillars 130 do not have sufficient heights to form the second source regions 136, semiconductor pillars such as silicon pillars may be additionally formed on the active pillars 130 using an epitaxial growth technique. In such a case, the second source regions 136 may be formed in respective ones of the semiconductor pillars. Similarly, even when the active pillars 130 do not have sufficient heights to form the common drain regions 134, the second channel regions surrounded by the second gate electrodes 162, and the second source regions 136, the semiconductor pillars may also be additionally formed on the active pillars 130. The semiconductor pillars may be formed using one of various epitaxial growth techniques, for example, a silicon epitaxial growth technique, a germanium epitaxial growth technique or a silicon-germanium epitaxial growth technique.

Referring to FIGS. 2 (a block 280), 18A, 18B and 18C, second capacitors 170 may be formed on respective ones of the second source regions 136. Specifically, the hard mask pattern 112 may be removed, and a storage node electrode layer may be formed on the fourth interlayer insulation layer 1710 and the second source regions 136. The storage node electrode layer may be patterned to form storage node electrodes 172 which are electrically connected to respective ones of the second source regions 136. For example, the storage node electrode layer may be formed on respective ones of the second source regions 136. The storage node electrode layer may be formed to include, for example, a doped silicon layer, a metal layer, a metal nitride layer or a conductive metal oxide layer. The metal layer may be a titanium (Ti) layer, a tantalum (Ta) layer, a tungsten (W) layer, an iridium (Ir) layer or a ruthenium (Ru) layer, and the metal nitride layer may be a titanium nitride (TiN) layer, a tantalum nitride (TaN) layer or a tungsten nitride (WN) layer. The conductive metal oxide layer may be a ruthenium oxide ($RuO_2$) layer or an iridium oxide ($IrO_2$) layer. The storage node electrode layer may be formed using a chemical vapor deposition (CVD) process, a sputtering process, an evaporation process or the like.

A capacitor dielectric layer 173 may be formed on the storage node electrodes 172. The capacitor dielectric layer 173 may be formed to include, for example, at least one of a tantalum oxide ($TaO_2$) layer, a zirconium oxide ($ZrO_2$) layer, an aluminum oxide ($Al_2O_3$) layer and a hafnium oxide ($HfO_2$) layer. The capacitor dielectric layer 173 may be formed using a chemical vapor deposition (CVD) process, an atomic layer deposition (ALD) process or the like. A plate electrode layer (174 of FIG. 1B) may then be formed on the capacitor dielectric layer 173. The plate electrode layer 174 may be formed to include, for example, at least one of a doped silicon layer, a titanium (Ti) layer, a tantalum (Ta) layer, a ruthenium (Ru) layer, an iridium (Ir) layer, a tungsten (W) layer, a titanium nitride (TiN) layer, a tantalum nitride (TaN) layer, a ruthenium oxide ($RuO_2$) layer and a tungsten nitride (WN) layer. The plate electrode layer 174 may be formed using a chemical vapor deposition (CVD) process, a sputtering process, an evaporation process or the like.

The semiconductor device including the unit cells shown in FIGS. 1A and 1B may be fabricated using the processes described above. As described above, according to the embodiments, multi-bit cells may be realized by forming active pillars on a semiconductor substrate, by forming vertical transistors in and on the active pillars, and by forming capacitors below and on the active pillars. Thus, the integration density of the semiconductor device may be improved in a limited planar area.

The example embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A semiconductor device comprising:
    a first capacitor in a trench of a semiconductor substrate;
    an active pillar disposed on a top surface of the semiconductor substrate opposite to the first capacitor, the active pillar including a first region, a first channel region, a second region, a second channel region and a third region which are sequentially stacked;
    a pillar connection pattern disposed on a storage node electrode of the first capacitor, the pillar connection pattern laterally extending to a first source region formed in the first region of the active pillar;
    a first gate electrode on a sidewall of the first channel region of the active pillar;
    a common drain region in the second region of the active pillar;
    a common bit line on a sidewall of the common drain region;
    a second gate electrode on a sidewall of the second channel region of the active pillar;
    a second source region in the third region of the active pillar; and
    a second capacitor on a top surface of the second source region opposite to the second channel region.

2. The semiconductor device of claim 1, wherein the first capacitor includes:
    a capacitor dielectric layer on a bottom surface and a sidewall of the trench;
    a storage node electrode on the capacitor dielectric layer; and
    a plate electrode disposed in the semiconductor substrate to surround the trench,
    wherein the pillar connection pattern electrically connects the storage node electrode to the first source region.

3. The semiconductor device of claim 1, further comprising:
    a first interlayer insulation layer between the pillar connection pattern and the first gate electrode;
    a second interlayer insulation layer between the first gate electrode and the common bit line; and
    a third interlayer insulation layer between the common bit line and the second gate electrode.

4. The semiconductor device of claim 1:
    wherein the first and second gate electrodes extend in a first direction which is parallel with the top surface of the semiconductor substrate; and
    wherein the common bit line extends in a second direction which is perpendicular to the first direction and parallel with the top surface of the semiconductor substrate.

5. The semiconductor device of claim 1, further comprising:
    a first gate dielectric layer between the first gate electrode and the first channel region; and
    a second gate dielectric layer between the second gate electrode and the second channel region.

6. The semiconductor device of claim 1, wherein the common bit line surrounds the sidewall of the common drain region.

7. The semiconductor device of claim 1, wherein the first gate electrode surrounds a sidewall of the first channel region and the second gate electrode surrounds a sidewall of the second channel region.

8. A semiconductor device comprising:
an active pillar disposed on a semiconductor substrate, the active pillar including a and which are spaced apart from each other and which are n-type doped regions;
a first capacitor disposed in a trench of the semiconductor substrate;
a pillar connection pattern with n-type doped silicon electrically connecting a storage node electrode of the first capacitor to the first source region;
a common bit line electrically connected to the common drain region;
a first gate electrode adjacent a first channel layer between the first source region and the common drain region, the first gate electrode being located between the first capacitor and the common bit line to transmit a bit signal;
a second capacitor electrically connected to the second source region; and
a second gate electrode adjacent a second channel layer between the second source region and the common drain region, the second gate electrode being located between the second capacitor and the common bit line to transmit the bit signal,
wherein the pillar connection pattern and the first source region are electrically insulated with an n-type doped plate electrode of the first capacitor by the p-type doped semiconductor substrate.

9. The semiconductor device of claim 8, further comprising a pillar connection pattern that electrically connects a storage node electrode of the first capacitor to the first source region.

10. The semiconductor device of claim 8,
wherein the first and second gate electrodes extend in a first direction which is parallel with a top surface of the semiconductor substrate; and
wherein the common bit line extends in a second direction which is perpendicular to the first direction and is parallel with the top surface of the semiconductor substrate.

11. The semiconductor device of claim 8, further comprising:
a first gate dielectric layer between the first gate electrode and the active pillar; and
a second gate dielectric layer between the second gate electrode and the active pillar.

12. The semiconductor device of claim 11, wherein a logic data corresponding to the bit signal on the common bit line is transmitted and stored into at least one of the first and second capacitors through at least one of the first and second channel layers.

13. A semiconductor device, comprising:
a first capacitor having a storage node electrode in a trench in a semiconductor substrate;
an active pillar disposed on a top surface of the semiconductor substrate adjacent to and displaced from the first capacitor, the active pillar including a first region, a second region, a third region, a fourth region, and a fifth region, which are sequentially stacked;
a first source region formed in the first region of the active pillar;
a pillar connection pattern disposed on the storage node electrode of the first capacitor, the pillar connection pattern laterally extending to the first source region;
a first gate electrode on a sidewall of a first channel region formed in the second region of the active pillar;
a common drain region formed in the third region of the active pillar;
a common drain electrode on a sidewall of the common drain region;
a second gate electrode on a sidewall of a second channel region formed in the fourth region of the active pillar;
a second source region formed in the fifth region of the active pillar; and
a second capacitor stacked on the active pillar and having a storage node electrode formed on a top surface of the second source region.

14. The semiconductor device of claim 13, wherein:
the first gate electrode surrounds the sidewall of the second region of the active pillar;
the common drain electrode surrounds the sidewall of the third region of the active pillar; and
the second gate electrode surrounds the fourth region of the active pillar.

15. A semiconductor memory array comprising a plurality of the semiconductor device of claim 14,
wherein a first word line connecting the first gate electrode in a row of the semiconductor devices extends in a first direction which is parallel with a top surface of the semiconductor substrate;
wherein a second word line connecting the second gate electrode in said row of the semiconductor devices extend in said first direction which is parallel with a top surface of the semiconductor substrate; and
wherein a common bit line connecting the common drain electrodes in a column of the semiconductor devices extends in a second direction which is perpendicular to the first direction and is parallel with the top surface of the semiconductor substrate.

* * * * *